US006959484B1

(12) United States Patent
Spangler et al.

(10) Patent No.: US 6,959,484 B1
(45) Date of Patent: Nov. 1, 2005

(54) SYSTEM FOR VIBRATION CONTROL

(75) Inventors: Ronald Spangler, Arlington, MA (US); Emanuele Bianchini, Charlestown, MA (US); Baruch Pletner, Newton, MA (US); Betsy Marsh, Brookline, MA (US); Robert Jacques, Andover, MA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/491,969

(22) Filed: Jan. 27, 2000

Related U.S. Application Data

(63) Continuation-in-part of application No. 09/261,475, filed on Feb. 26, 1999, now Pat. No. 6,404,107, which is a continuation-in-part of application No. 08/943,645, filed on Oct. 3, 1997, now Pat. No. 6,069,433, which is a continuation-in-part of application No. 08/188,145, filed on Jan. 27, 1994, now Pat. No. 6,420,819.
(60) Provisional application No. 60/117,671, filed on Jan. 28, 1999.

(51) Int. Cl.[7] .......................... B23P 21/00; H01L 41/08
(52) U.S. Cl. ............................. 29/709; 29/720; 29/721; 29/729; 29/740; 29/744; 29/25.35; 310/328; 310/330; 310/366
(58) Field of Search ........................... 29/709, 720, 72, 29/740, 832, 25.35, 25.01, 830, 841; 310/338, 336, 334, 365, 326, 345; 367/164, 155; 700/63, 45; 355/53, 33, 72

(56) References Cited

U.S. PATENT DOCUMENTS 3,573,511 A    4/1971  Noren et al. .................. 310/8.6
3,582,691 A    6/1971  Sonderegger et al. ........ 310/328
4,054,808 A   10/1977  Tanaka ......................... 310/366

(Continued)

FOREIGN PATENT DOCUMENTS

| DE | 24 35 910 | 2/1975 | ................. 310/324 |
| EP | 0 005 265 | 11/1979 | |
| EP | 0309211 | * 3/1989 | |
| GB | 1370164 | 10/1974 | ................. 310/324 |
| JP | 03265734 | 11/1991 | |
| JP | 5-248489 | * 9/1993 | ................. 188/378 |
| JP | 06053114 | 2/1994 | |
| JP | 08326835 | 12/1996 | |
| JP | 11008181 | 1/1999 | |
| WO | WO 91/12953 | 9/1991 | |
| WO | 9520827 | 8/1995 | |

OTHER PUBLICATIONS

R/flex Circuit Materials Product Data Sheet DS20903J, "Flex–I–MID 3000, High Performance Adhesiveless Circuit Materials", by Rogers Corporation, Microwave and Circuit Materials Division.

*Primary Examiner*—Minh Trinh
(74) *Attorney, Agent, or Firm*—William C. Cray; Cymer, Inc.

(57) ABSTRACT

A vibration control system comprising an actuator, and a sensor useful for controlling vibrations in systems for fabricating electronics equipment. The actuator may comprise one or more plates or elements of electro-active material bonded to an electroded sheet.

28 Claims, 20 Drawing Sheets

U.S. PATENT DOCUMENTS

| | | | |
|---|---|---|---|
| 4,194,194 A | 3/1980 | Redfern | 340/566 |
| 4,240,002 A | 12/1980 | Tosi et al. | 310/324 |
| 4,363,991 A | 12/1982 | Edelman | 310/338 |
| 4,458,173 A | 7/1984 | Kaufman et al. | 310/330 X |
| 4,461,179 A | 7/1984 | Holt | 73/658 |
| 4,578,611 A | 3/1986 | Sadler | 310/338 |
| 4,611,141 A | 9/1986 | Hahada et al. | 310/334 |
| 4,651,310 A | 3/1987 | Kaneko et al. | 310/800 |
| 4,680,595 A | 7/1987 | Cruz-Uribe et al. | 346/140 |
| 4,732,351 A | 3/1988 | Bird | 310/800 |
| 4,742,264 A | 5/1988 | Ogawa | 310/332 |
| 4,761,582 A | 8/1988 | McKee | 310/322 |
| 4,849,668 A | 7/1989 | Crawley et al. | 310/328 |
| 4,857,887 A | 8/1989 | Iten | 310/340 |
| 4,864,179 A | 9/1989 | Lapetina et al. | 310/366 |
| 4,914,565 A | 4/1990 | Schnoeller et al. | 310/366 |
| 4,976,415 A | 12/1990 | Murai et al. | 267/136 |
| 5,030,007 A | 7/1991 | Calhoun et al. | 356/346 |
| 5,042,784 A | 8/1991 | Murai | 267/136 |
| 5,133,527 A | 7/1992 | Chen et al. | 248/550 |
| 5,156,370 A | 10/1992 | Silcox et al. | 248/550 |
| 5,209,326 A | 5/1993 | Harper | 188/378 |
| 5,285,995 A | 2/1994 | Gonzalez et al. | 248/550 |
| 5,305,507 A | 4/1994 | Dvorsky et al. | 310/340 |
| 5,311,362 A * | 5/1994 | Matsumoto et al. | 359/738 |
| 5,315,203 A | 5/1994 | Bicos | 310/358 |
| 5,379,980 A | 1/1995 | Houghton et al. | 248/550 |
| 5,400,488 A * | 3/1995 | Ohno et al. | 29/25.35 |
| 5,404,067 A | 4/1995 | Stein et al. | 310/330 |
| 5,415,175 A | 5/1995 | Hanafy et al. | 128/662.03 |
| 5,438,998 A | 8/1995 | Hanafy | 128/662.03 |
| 5,446,519 A * | 8/1995 | Makinouchi | 355/53 |
| 5,448,232 A | 9/1995 | Tyburski | 340/933 |
| 5,458,222 A | 10/1995 | Pla et al. | 188/378 |
| 5,473,214 A | 12/1995 | Hildebrand | 310/321 |
| 5,493,541 A | 2/1996 | Snyder | 367/155 |
| 5,525,853 A | 6/1996 | Nye et al. | 310/316 |
| 5,579,084 A | 11/1996 | Takahashi et al. | 355/53 |
| 5,610,686 A | 3/1997 | Osanai | 355/72 |
| 5,622,748 A | 4/1997 | Takeuchi et al. | 427/100 |
| 5,626,332 A | 5/1997 | Phillips et al. | 267/140.14 |
| 5,632,841 A | 5/1997 | Hellbaum et al. | |
| 5,650,853 A | 7/1997 | Honda | 356/359 |
| 5,656,882 A | 8/1997 | Lazarus et al. | 310/328 |
| 5,687,462 A * | 11/1997 | Lazarus et al. | 29/25.35 |
| 5,765,800 A | 6/1998 | Watanabe et al. | 248/550 |
| 5,802,966 A | 9/1998 | Schoch | 100/35 |
| 5,838,092 A * | 11/1998 | Wang et al. | 310/326 |
| 5,881,987 A | 3/1999 | Hara | 248/550 |
| 5,894,651 A | 4/1999 | Dvorsky et al. | 310/344 |
| 5,970,168 A | 10/1999 | Montesanto et al. | 382/149 |
| 5,982,128 A | 11/1999 | Lee | 318/568.16 |
| 6,008,881 A | 12/1999 | Warmerdam et al. | 355/53 |
| 6,011,373 A | 1/2000 | McConnell et al. | 318/560 |
| 6,031,598 A | 2/2000 | Tichenor et al. | 248/550 |
| 6,060,813 A | 5/2000 | Nowak | 310/314 |
| 6,062,551 A | 5/2000 | Oku et al. | 267/140 |
| 6,069,433 A | 5/2000 | Lazarus et al. | 310/333 |
| 6,069,683 A | 5/2000 | Iwamoto | 355/53 |
| 6,271,640 B1 | 8/2001 | Lee | 318/560 |
| 6,294,891 B1 | 9/2001 | McConnell et al. | 318/619 |
| 2001/0027595 A1 * | 10/2001 | Saiki | 29/25.01 |
| 2002/0101253 A1 * | 8/2002 | Pletner et al. | 324/727 |

* cited by examiner

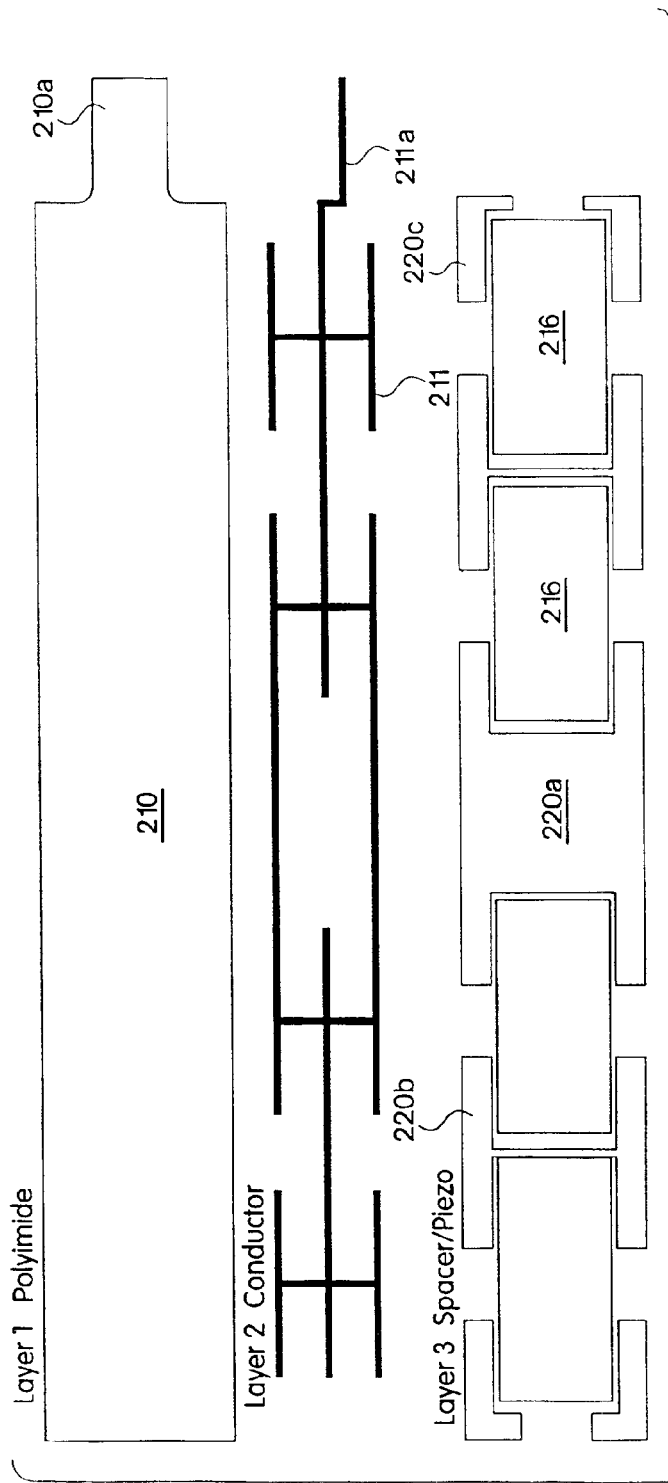
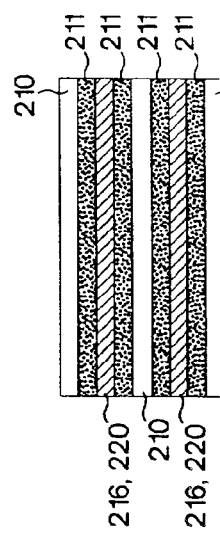
Fig. 5
Fig. 5A

Fig. 17
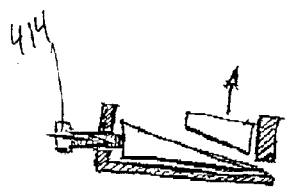
Fig. 18
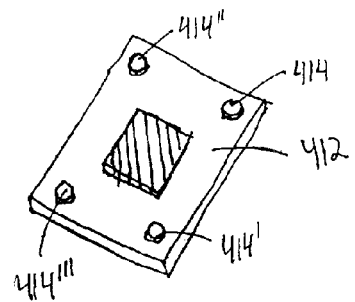
Fig. 19
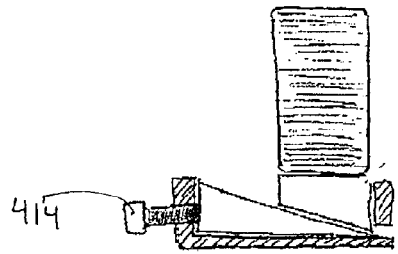
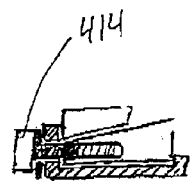
Fig. 20

SYSTEM FOR VIBRATION CONTROL

RELATED APPLICATIONS

This application claims the benefit of U.S. application No. 60/117,671, filed Jan. 28, 1999, and is a continuation-in-part of U.S. application Ser. No. 09/261,475, filed Feb. 26, 1999, now U.S. Pat. No. 6,404,107, issued Jul. 31, 2001, which is a continuation-in-part of U.S. application Ser. No. 08/943,645, filed Oct. 3, 1997, now U.S. Pat. No. 6,069,433, issued May 30, 2000, which is a continuation-in-part of U.S. application Ser. No. 08/188,145, filed Jan. 27, 1994, now U.S. Pat. No. 6,420,819, issued Jul. 16, 2002, the disclosures of each of which are hereby incorporated by reference herein.

BACKGROUND OF THE INVENTION

In the competitive marketplace which exists for automated surface-mount (SMT) electronics equipment, including systems for fabricating electronics equipment or components, improvements in accuracy and speed are a significant advantage. Such equipment is often used in fabricating, for example, semiconductor chips, printed circuit boards, liquid crystal displays, and thin film devices, and may feature multiple gantry/head assemblies, linear motors, photoimaging systems, etching systems, and/or a number of other technologies. The present invention relates to devices and methods for reducing vibration inherent in such equipment during operation thereby to improve the speed and/or accuracy of such equipment.

For example, modern photolithography tools require extremely high exposure accuracy. This can only be achieved if the levels of elastic displacement at crucial points in the tool do not exceed several nano-meters. Since lithography tools contain numerous moving parts such as the reticle and wafer stages, they are subject to persistent disturbing forces acting on their structure. Moreover, the tool structure is subject to environmental disturbances such as floor vibrations and air turbulence. While the level of these disturbances can be reduced, they cannot be eliminated in their entirety.

There are a number of existing techniques employed to limit the elastic vibration of lithography tools. For example, the stiffness of the structure that supports key elements such as the lens assembly may be increased, tuned mass dampers may be used, the signals applied to the moving stages may be shaped, or the floor vibrations may be isolated using actively controlled air springs. While effective in reducing elastic vibration, these methods often do not meet the stringent requirements of more advanced photolithography tools.

Current efforts to control vibration on SMT placement equipment include placing frictional damping device at the end of the gantry. This "friction block" serves mainly to stabilize the gantry and head trajectory control system, but it also has been shown to reduce the settling time during certain pick and place operations. However, the effectiveness of the friction block depends on precise tuning of the normal force (or pre-load). The friction block tends to wear out quickly, greatly reducing its effectiveness and contaminating the rest of the machine with particles. Moreover, the friction block works against rigid body movement, resulting in slower operation of the equipment. The vibration control system of the present invention, which comprises an actuator assembly, serves to replace the friction block entirely while improving settling time, or, alternatively, to operate in conjunction with the friction block, providing additional accuracy or speed of operation.

One aspect of the present invention relates to actuator elements useful for active vibration reduction, structural control, dynamic testing, precision positioning, motion sensing and control, and active damping. Electro-active materials, such as piezoelectric, electrostrictive or magnetostrictive materials, are useful in such tasks. In one embodiment of the invention, bare electro-active elements are used. In another embodiment, packaged electro-active elements, as described herein, are used.

Thus, improvements are desirable in the manner in which vibration is controlled in systems for fabricating electronic components, as well as the manner in which an actuator is attached to the equipment to be controlled.

SUMMARY OF THE INVENTION

In one embodiment of the invention, a vibration control system is provided comprising an actuator assembly, and a sensor for sensing a parameter of movement or performance. The vibration control system is particularly useful for controlling vibration in systems for fabricating electronics components, which often include one or more gantry assemblies, head assemblies, and/or moving stages or components. Contemplated systems for fabricating electronics components include, but are not limited to, pick and place systems, lithography systems, and those used to fabricate semiconductor chips, printed circuit boards, liquid crystal displays, and thin film devices. However, the devices and methods of the invention would be useful in fabricating systems of any sort, such as machine tool equipment, milling equipment, or systems used in an automated assembly line. Also contemplated are systems for fabricating electronic components wherein the systems comprise a lens system, a wafer stage, and a structure for supporting the lens system and wafer stage where the lens system creates an image on the wafer stage such as would be used in modern photolithography.

In one embodiment, an active vibration control system for use with a photolithography fabricating system includes the following components: a sensor that measures the displacement levels at the key points, or provides information from which such information can be estimated; a digital or analog processor that can compute a control signal based on the sensors input, and an actuator that can induce elastic displacement in the structure.

In a particularly preferred embodiment, an actuator useful in an active vibration control system used in conjunction with photolithography tools is non-reactive and does not require back support (actuators that require back support may excite elastic vibrations in the support structure, which may be re-introduced unto the tool), and has a very low distortion profile (an actuator array designed to control structural vibration at a given frequency or band must not excite any vibration outside that band).

In a particularly preferred embodiment, a vibration control system in accordance with the invention comprises an induced-strain actuator that acts directly on the strain state of the structure, and has virtually no distortion. Such an actuator can excite, and therefore control, only the elastic vibration modes of the controlled structure, leaving all other vibration modes (such as the modes of various equipment housing structures, etc.) uncontrolled. This contributes to the control system simplicity and robustness.

In another preferred embodiment of the invention, the vibration control system further comprises a circuit in electrical communication with the actuator assembly and the sensor. In one embodiment, the sensor relays information about movement, vibration or performance to the circuit, which, in response, signals the actuator assembly to control vibration. The vibration in the systems in which the present invention are useful may be due to external disturbance or due to the inherent disturbances generated by the system itself.

In yet another preferred embodiment of the invention, the vibration control system further comprises an electrical connection to the fabricating system. The electrical connection may provide for the fabricating system to send to, or receive from the vibration control system information such as abling or disabling signals, system status signals, or fault/error status signals. In another embodiment, a circuit according to the invention further comprises a control system comprising at least one controller. Such a control system may permit auto-tuning, gain scheduling, external gain control, or it may be a linear feed forward control, or may serve as another source of feedback control.

In an embodiment of the invention wherein the vibration control system has an auto-tuning control, prior to operation, the control system injects one or more test signals into the system and measures the response. The measured response is used to refine an internal model of the plant, and the control gains are modified accordingly. Control gains are kept constant while the loop is closed.

In an embodiment of the invention wherein the vibration control system has a gain scheduling control, the controllers are designed for the system at several different operating points. In the case of a pick and place machine, these points would be different positions of the pick and place head. The controllers are stored in memory in the digital control system. During operation, sensors feed information to the controller describing the configuration of the machine in real time. As the system moves through each operating point, the control system switches to the optimal control gains for that point. A variant of this is that the control gains used at any point in time are a linear interpolation of the gains from several controllers stored in memory for several nearby operating points.

In an embodiment of the invention wherein the vibration control system has an external gain control, the control system includes an input which connects to the computer system which monitors the overall performance of the machine. The controller implemented at any instant in time has a gain which is proportional to this signal. The monitoring system modifies this gain until optimal performance is achieved. If performance begins to move out of specification due to slow time variation, the monitoring system would repeat the gain optimization sequence.

In an embodiment of the invention wherein the vibration control system has a feed forward control, in addition to the feedback control (controller driven by signals originating from sensors which monitor the structural vibration), an additional signal which is in phase with a harmonic disturbance (such as motor rotation) is provided to the controller. The controller feeds forward a filtered version of this signal. The gains which adjust the magnitude and phase of the feed forward control relative to the disturbance signal are adjusted adaptively to minimize the influence of the disturbance on the performance.

In certain embodiments of the invention, the actuator assembly may comprise a strain actuator, an electroative strain actuator, a piezoceramic strain actuator, an electroactive stack actuator, or at least two actuators. In yet another embodiment of the invention, the actuator assembly is in electrical communication with the sensor.

Also in certain embodiments of the invention, the sensor may comprise a strain sensor, an accelerometer, laser displacement sensor, laser interferometer, or at least two sensors. In another embodiment of the invention, the sensor may comprise at least two sensors measuring at least two different signals. In a preferred embodiment, the sensor directly measures some aspect directly related to performance of the systems in which the present invention is useful.

In a particularly preferred embodiment of the invention, the vibration control system comprises an electronic link or cable providing information about the trajectory of a gantry and head.

An actuator assembly according to the present invention may include one or more strain elements, such as a piezoelectric or electrostrictive plate, shell, fiber or composite; a housing forming a protective body about the element; and electrical contacts mounted in the housing and connecting to the strain element; these parts together forming a flexible card. At least one side of the assembly includes a thin sheet which is attached to a major face of the strain element, and by bonding the outside of the sheet to an object a stiff shear-free coupling is obtained between the object and the strain element in the housing.

In a preferred embodiment, the strain elements are piezoceramic plates, which are quite thin, preferably between slightly under an eighth of a millimeter to several millimeters thick, and which have a relatively large surface area, with one or both of their width and length dimensions being tens or hundreds of times greater than the thickness dimension. A metallized film makes electrode contact, while a bonding agent and insulating material hermetically seal the device against delamination, cracking and environmental exposure. The bonding agent used may be an epoxy, such as B-stage or C-stage epoxy, a thermoplastic, or any other material useful in bonding together the piezoceramic plate, metallized film and insulating material. The specific bonding agent used will depend on the intended application of the device. In a preferred embodiment, the metallized film and insulating material are both provided in a flexible circuit of tough polymer material, which thus provides robust mechanical and electrical coupling to the enclosed elements. Alternatively, the metallized film may be located directly on the piezoceramic plate, and the insulating material may have electrical contacts.

By way of illustration, an example below describes a construction utilizing rectangular PZT plates a quarter millimeter thick, with length and width dimensions each of one to three centimeters, each element thus having an active strain-generating face one to ten square centimeters in area. The PZT plates are mounted on or between sheets of a stiff strong polymer, e.g., one half, one or two mil polyimide, which is copper clad on one or both sides and has a suitable conductive electrode pattern formed in the copper layer for contacting the PZT plates. Various spacers surround the plates, and the entire structure is bonded together with a structural polymer into a waterproof, insulated closed package, having a thickness about the same as the plate thickness, e.g., 0.30 to 0.50 millimeters. So enclosed, the package may bend, extend and flex, and undergo sharp impacts, without fracturing the fragile PZT elements which are contained within. Further, because the conductor pattern is firmly attached to the polyimide sheet, even cracking of the PZT element does not sever the electrodes, or prevent actuation over the full area of the element, or otherwise significantly degrade its performance.

The thin package forms a complete modular unit, in the form of a small "card", complete with electrodes. The package may then conveniently be attached to bonding one face to a structure so that it couples strain between the enclosed strain element and the structure. This may be done for example, by simply attaching the package with an adhesive to establish a thin, high shear strength, coupling with the PZT plates, while adding minimal mass to the system as a whole. The plates may be actuators, which couple energy into the attached structure, or sensors which respond to strain coupled from the attached structure.

In different embodiments, particular electrode patterns are selectively formed on the sheet to either pole the PZT plates in-plane or cross-plane, and multiple layers of PZT elements may be arranged or stacked in a single card to result in bending or shear, and even specialized torsional actuation.

In accordance with a further aspect of the invention, circuit elements are formed in, or with, the vibration control system to filter, shunt, or process the signal produced by the PZT elements, to sense the mechanical environment, or even to locally perform switching or power amplification for driving the actuation elements. The actuator package may be formed with pre-shaped PZT elements, such as half-cylinders, into modular surface-mount shells suitable for attaching about a pipe, rod or shaft.

BRIEF DESCRIPTION OF THE DRAWINGS

These and other desirable properties of the invention will be understood from the detailed description of illustrative embodiments, wherein:

FIGS. 5 and 5A show details of the layer structure of the card of FIG. 3;

FIGS. 17–20 show different embodiments of the invention as used with a fabricating system;

DETAILED DESCRIPTION OF THE INVENTION

Applicants have developed a vibration control system particularly useful for controlling vibration in a system for fabricating electronics components. The vibration control system of the invention is useful for controlling vibration that is either externally produced in the system for fabricating components, or is internal to or inherent in the system. Internal vibration may be caused by various motors, such as step or D.C. motors, or hydraulic or pneumatic actuators used in a fabricating system.

A vibration control system according to the invention may comprise electroactive actuators and sensors, integrated with the fabricating system. The control and power electronics may be separate units, located adjacent to the equipment and connected to the actuators and sensors through appropriate linking cabling. Alternatively, the control and power electronics may be a fully integrated system with the fabricating system.

The electroactive actuator may be secured to or within the fabricating system in various ways. As shown in FIGS. 17, 19, and 20, for example, the actuator may be fixed into place by a bolt 414 either pushing against or going through the actuator. Alternatively, the actuator may be secured by friction, tension, or otherwise force fit. In one embodiment, as shown in FIG. 18, the actuator is bonded to a plate 412, which, in turn, is bolted to a component of a fabricating system with bolts 414, 414', 414", and 414'". In another embodiment, the actuator is bonded to a plate, which is bolted to a second plate, and the second plate is then bolted to a component of the fabricating component. In another embodiment, the actuator assembly is detachably secured within the vibration control system, or detachably secured to a component of a fabricating system.

Figure 21:
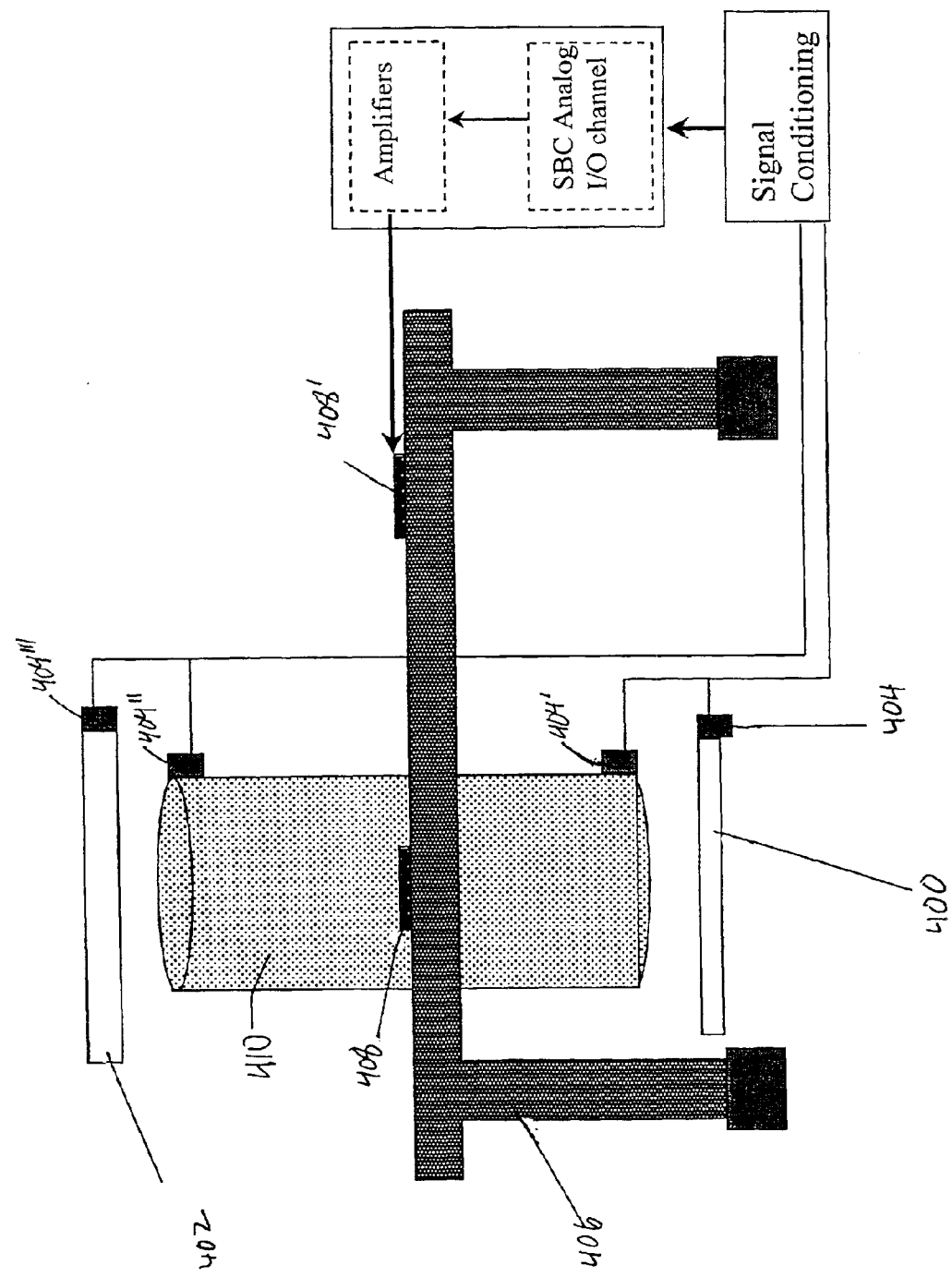
FIG. 21 shows an embodiment of the invention as used with a fabricating system.

FIG. 21 shows an embodiment of the invention as used in a fabricating system. In this embodiment, the fabricating system comprises a wafer stage 400, a reticle stage 402, laser interferometers 404, 404', 404", and 404'" with X&Y mirrors, and a support structure 406. The support structure 406 supports a lens assembly 410. The interferometers 404, 404', 404", and 404'" are located on the wafer stage 400, the reticle stage 402, and on the lens assembly 410. Mounted on the support structure 406 are two actuators 408 and 408' comprising, for example, an electroactive element. Each of the actuators 408 and 408' are in electrical communication with a circuit. Signals from the interferometers 404, 404', 404", and 404'" are relayed through an SBC analog I/O channel and amplifiers to the actuators 408 and 408', which, in response, controls vibration within the fabricating system. By controlling the vibration within the fabricating system, the accuracy of the placement and absolute size of the metallized traces in the semiconductor on a wafer stage may be improved. Alternatively or in addition, the through-put of the fabrication system may be increased without decreasing accuracy.

Figure 1A:
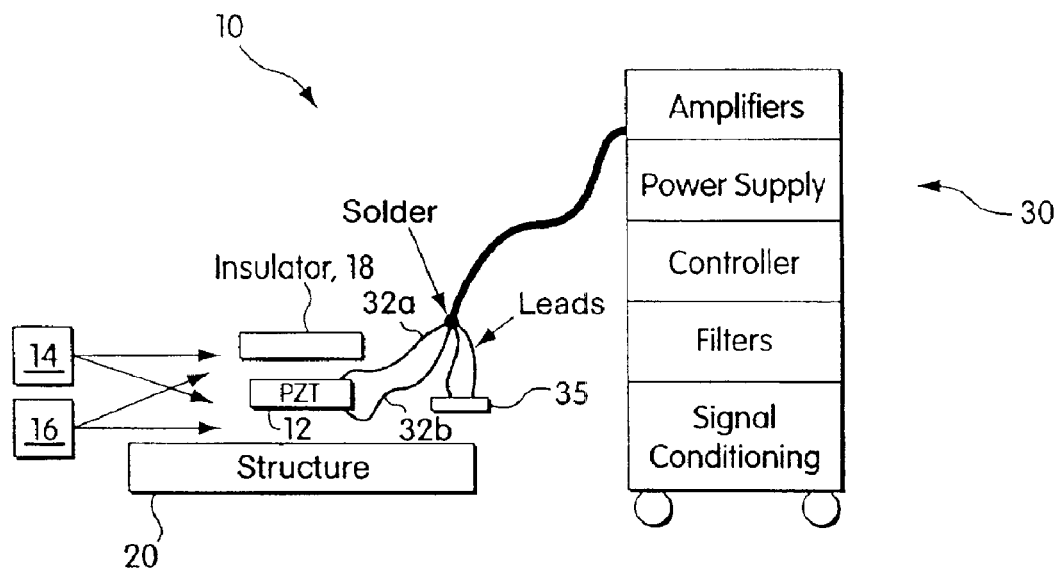
FIG. 1A is a system illustration of a typical prior art actuator.

Useful in this invention are electroactive actuator assemblies. FIG. 1A illustrates in schema the process and overall arrangement of a prior art surface mounted piezoelectric actuator assembly 10. A structure 20, which may be a structural or machine element, a plate, airfoil or other interactive sheet, or a device or part thereof has a sheet 12 of smart material bonded thereto by some combination of conductive and structural polymers, 14, 16. An insulator 18, which may be formed entirely or in part of the structural polymer 16, encloses and protects the smart material, while conductive leads or surface electrodes are formed or attached by the conductive polymer. An external control system 30 provides drive signals along lines 32a, 32b to the smart material, and may receive measurement signals from surface-mounted instrumentation such as a strain gauge 35, from which it derives appropriate drive signals. Various forms of control are possible. For example, the strain gauge may be positioned to sense the excitation of a natural resonance, and the control system 30 may simply actuate the PZT element in response to a sensor output, so as to stiffen the structure, and thereby shift its resonant frequency. Alternatively, a vibration sensed by the sensor may be fed back as a processed phase-delayed driving signal to null out an evolving dynamic state, or the actuator may be driven for motion control. In better-understood mechanical systems, the controller may be programmed to recognize empirical conditions, i.e., aerodynamic states or events, and to select special control laws that specify the gain and phase of a driving signal for each actuator 12 to achieve a desired change.

For all such applications, major work is required to attach the bare PZT plate to its control circuitry and to the workpiece, and many of the assembly steps are subject to failure or, when quantitative control is desired, may require extensive modeling of the device after it has been assembled, in order to establish control parameters for a useful mode of operation that are appropriate for the specific thicknesses and mechanical stiffnesses achieved in the fabrication process. A benefit of packaging an electroactive element when bonding to the plate is that electrical isolation or capacitive decoupling from the plate, structure or any part of the fabrication system may be achieved.

Figure 1B:
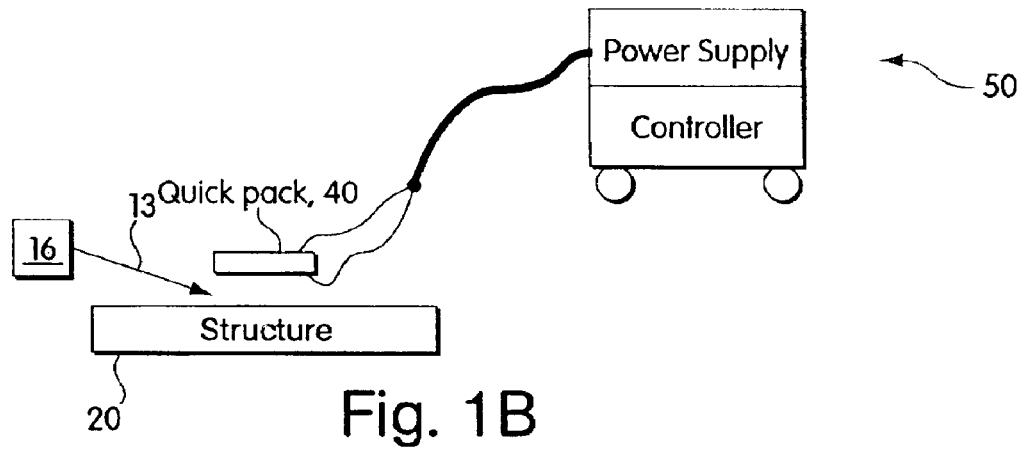
FIGS. 1B and 1C are corresponding illustrations of two systems in accordance with the present invention.

FIG. 1B shows an actuator assembly useful in one embodiment of the present invention. As shown, it is a modular pack or card 40 that simply attaches to a structure 20 with a quick setting adhesive, such as a five-minute epoxy 13, or in other configurations attaches at a point or line. The operations of sensing and control that benefit from a more readily installable and uniformly modeled actuator structure. In particular, the modular pack 40 has the form of a card, a stiff but bendable plate, with one or more electrical connectors preferably in the form of pads located at its edge (not shown) to plug into a multi-pin socket so that it may connect to a simplified control system 50. As discussed in greater detail below with respect to FIG. 2C, the modular package 40 may also incorporate planar or low-profile circuit elements, which may include signal processing elements, such as weighting or shunting resistors, impedance matchers, filters and signal conditioning preamplifiers, and may further include switching transistors and other elements to operate under direct digital control, so that the only external electrical connections necessary are those of a microprocessor or logic controller, and a power supply.

Figure 1C:
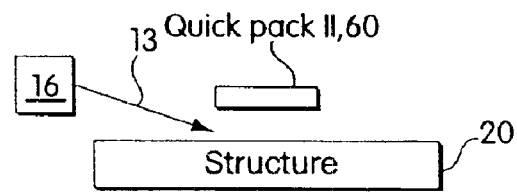

In a further embodiment particularly applicable to some low power control situations, a modular package 60 as shown in FIG. 1C may include its own power source, such as a battery or power cell, and may include a controller, such as a microprocessor chip or programmable logic array, to operate on-board drivers and shunts, thus effecting a complete set of sensing and control operations without any external circuit connections.

The present invention specifically pertains to piezoelectric polymers, and to materials such as sintered metal zirconate, niobate crystal or similar piezoceramic materials that are stiff, yet happen to be quite brittle. It also pertains to electrostrictive materials. As used in the claims below, both piezoelectric and electrostrictive elements, in which the material of the elements has an electromechanical property, will be referred to as electroactive elements. High stiffness is essential for efficiently transferring strain across the surface of the element to an outside structure or workpiece, typically made of metal or a hard structural polymer, and the invention in its actuator aspect does not generally contemplate soft polymer piezoelectric materials. While the terms "stiff" and "soft" are relative, it will be understood that in this context, the stiffness, as applied to an actuator, is approximately that of a metal, cured epoxy, high-tech composite, or other stiff material, with a Young's modulus greater than $0.1 \times 10^6$ psi, and preferably greater than $2 \times 10^6$ psi. When constructing sensors, instead of actuators, the invention also contemplates the use of low-stiffness piezoelectric materials, such as polyvinylidene difluoride (PVDF) film and the substitution of lower cure temperature bonding or adhesive materials. The principle construction challenges, however, arise with the first class of piezo material noted above, and these will now be described.

In general, the invention includes novel forms of actuators and methods of making such actuators, where "actuator" is understood to mean a complete and mechanically useful device which, when powered, couples force, motion or the like to an object or structure. In its broad form, the making of an actuator involves "packaging" a raw electroactive element to make it mechanically useful. By way of example, raw electroactive piezoelectric materials or "elements" are commonly available in a variety of semi-processed bulk material forms, including raw piezoelectric material in basic shapes, such as sheets, rings, washers, cylinders and plates, as well as more complex or composite forms, such as stacks, or hybrid forms that include a bulk material with a mechanical element, such as a lever. These materials or raw elements may have metal coated on one or more surfaces to act as electrical contacts, or may be non-metallized. In the discussion below, piezoelectric materials shall be discussed by way of example, and all these forms of raw materials shall be referred to as "elements", "materials", or "electroactive elements". As noted above, the invention further includes structures or devices made by these methods and operating as transducers to sense, rather than actuate, a strain, vibration, position or other physical characteristic, so that where applicable below, the term "actuator" may include sensing transducers.

Embodiments of the invention employ these stiff electrically-actuated materials in thin sheets—discs, annuli, plates and cylinders or shells—that are below several millimeters in thickness, and illustratively about one fifth to one quarter millimeter thick. Advantageously, this thin dimension allows the achievement of high electric field strengths across a distance comparable to the thickness dimension of the plate at a relatively low overall potential difference, so that full scale piezoelectric actuation may be obtained with driving voltages of ten to fifty volts, or less. Such a thin dimension also allows the element to be attached to an object without greatly changing the structural or physical response characteristics of the object. However, in the prior art, such thin elements are fragile, and may break due to irregular stresses when handled, assembled or cured. The impact from falling even a few centimeters may fracture a piezoceramic plate, and only extremely small bending deflections are tolerated before breaking.

In accordance with the present invention, the thin electrically actuated element is encased by layers of stiff insulating material, at least one of which is a tough film which has patterned conductors on one of its surfaces, and is thinner than the element itself. A package is assembled from the piezo elements, insulating layers, and various spacers or structural fill material, such that altogether the electrodes, piezo element(s), and enclosing films or layers form a sealed card of a thickness not substantially greater than that of the bare actuating element. Where elements are placed in several layers, as will be described below, the package thickness is not appreciably greater than the sum of the thicknesses of the stacked actuating elements.

Figure 2A:
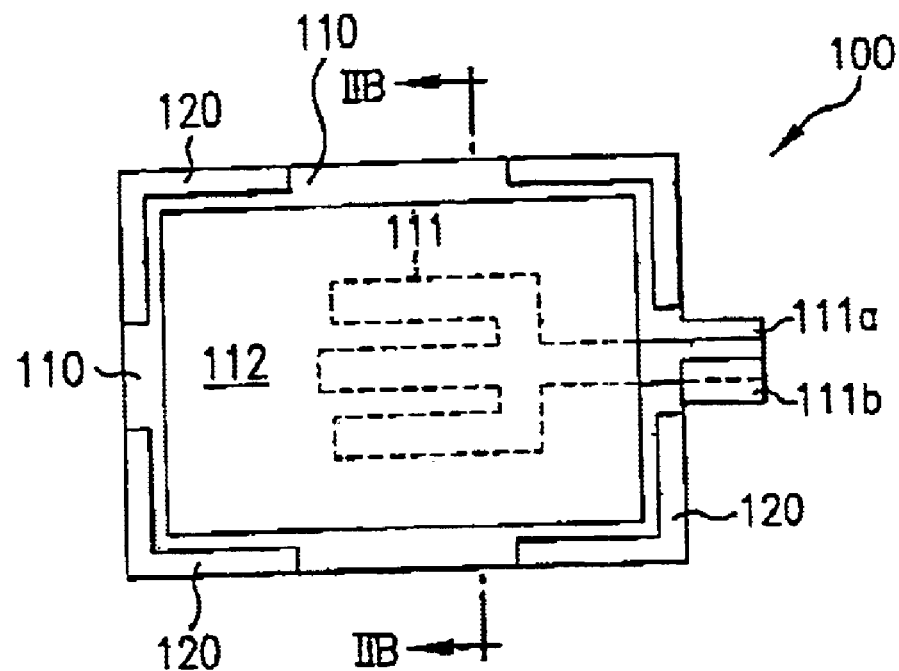
FIGS. 2A and 2B show top and cross-sectional views, respectively, of a basic actuator or sensor card in accordance with the present invention.

FIG. 2A illustrates a basic embodiment 100 of the invention. A thin film 110 of a highly insulating material, such as a polyimide material, is metallized, typically copper clad, on at least one side, and forms a rectangle which is coextensive with or slightly larger than the finished actuator package. A suitable material available for use in fabricating multilayer circuit boards is distributed by the Rogers Corporation of Chandler, Ariz. as their Flex-I-Mid 3000 adhesiveless circuit material, and consists of a polyimide film formed on a rolled copper foil. A range of sizes are available commercially, with the metal foils being of 18 to 70 micrometer thickness, integrally coated with a polyimide film of 13 to 50 micrometer thickness. Other thicknesses may be fabricated. In this commercial material, the foil and polymer film are directly attached without adhesives, so the metal layer may be patterned by conventional masking and etching, and multiple patterned layers may be built up into a multilayer board in a manner described more fully below, without residual adhesive weakening the assembly or causing delamination. The rolled copper foil provides high in-plane tensile strength, while the polyimide film presents a strong, tough and defect-free electrically insulating barrier.

In constructions described below, the film constitutes not only an insulator over the electrodes, but also an outer surface of the device. It is therefore required to have high dielectric strength, high shear strength, water resistance and an ability to bond to other surfaces. High thermal resistance is necessary in view of the temperature cure used in the preferred fabrication process, and is also required for some application environments. In general, polyamide/imides have been found useful, but other materials, such as polyesters or thermoplastics with similar properties, may also be used.

In the present constructions, the foil layer is patterned by conventional masking and etch techniques (for example, photoresist masking and patterning, followed by a ferric chloride etch), to form electrodes for contacting the surface of piezo plate elements. Alternatively, a more ductile, thin conductive layer may be used. For example, a thin conductive layer may be printed on the polymer film or directly on the piezoelectric element using silver conductive ink. In FIG. 2A, electrodes 111 extend over one or more subregions of the interior of the rectangle, and lead to reinforced pads or lands 111a, 111b extending at the edge of the device. The electrodes are arranged in a pattern to contact a piezoelectric element along a broadly-turning path, which crosses the full length and width of the element, and thus assures that the element remains connected despite the occurrence of a few cracks or local breaks in the electrode or the piezo element. Frame members 120 are positioned about the perimeter of sheet 110, and at least one piezoelectric plate element 112 is situated in the central region so that it is contacted by the electrodes 111. The frame members serve as edge binding, so that the thin laminations do not extend to the edge, and they also function as thickness spacers for the hot-press assembly operation described further below, and as position-markers which define the location of piezo plates that are inserted during the initial stages of assembling the laminated package.

FIG. 2A is a somewhat schematic view, inasmuch as it does not show the layer structure of the device which secures it together, including a further semi-transparent top layer 110 (FIG. 2B), which in practice extends over the plate 112 and together with the spacers 120 and sheet 110 closes the assembly. A similar layer 114 is placed under the piezo element, with suitable cut-outs to allow the electrodes 111 to contact the element. Layers 114, 116 are preferably formed of a curable epoxy sheet material, which has a cured thickness equal to the thickness of the metal electrode layer, and which acts as an adhesive layer to join together the material contacting it on each side. When cured, this epoxy constitutes the structural body of the device, and stiffens the assembly, extending entirely over a substantial portion of the surface of the piezo element to strengthen the element and arrest crack growth, thereby enhancing its longevity. Furthermore, epoxy from this layer actually spreads in microscopically thin but highly discontinuous film 116, about 0.0025 mm thick, over the electrodes, bonding them firmly to the piezo plate, but with a sufficient number of voids and pinholes so that direct electrical contact between the electrodes and piezo elements still occurs over a substantial and distributed contact area.

Figure 2B:
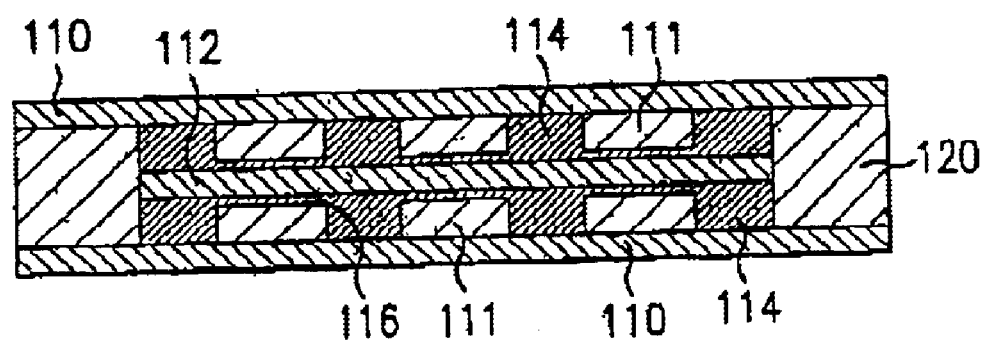

FIG. 2B shows a cross-sectional view, not drawn to scale, of the embodiment of FIG. 2A. By way of rough proportions, taking the piezoelectric plate 112 as 0.2–0.25 millimeters in thickness, the insulating film 110 is much thinner, no more than one-tenth to one-fifth the plate thickness, and the conductive copper electrode layer 111 may have a thickness typically of ten to fifty microns, although the latter range is not a set of strict limits, but represents a useful range of electrode thicknesses that are electrically serviceable, convenient to manufacture and not so thick as to either impair the efficiency of strain transfer or introduce delamination problems. The structural epoxy 114 fills the spaces between electrodes 111 in each layer, and has approximately the same thickness as those electrodes, so that the entire assembly forms a solid block. The spacers 120 are formed of a relatively compressible material, having a low modulus of elasticity, such as a relatively uncrosslinked polymer, and, when used with a pressure-cured epoxy as described below, are preferably of a thickness roughly equivalent to the piezoceramic plate or stack of elements, so that they form an edge binding about the other components between the top and bottom layers of film 110.

A preferred method of manufacture involves applying pressure to the entire package as the layer 114 cures. The spacers 120 serve to align the piezoceramic plates and any circuit elements, as described below with reference to FIGS. 3–5, and they form a frame that is compressed slightly during assembly in the cure step, at which time it may deform to seal the edges without leaving any stress or irregularities. Compression eliminates voids and provides a dense and crack-free solid medium, while the curing heat effects a high degree of cross-linking, resulting in high strength and stiffness.

An assembly process for the embodiment of FIGS. 2A, 2B is as follows. One or more pieces of copper clad polyimide film, each approximately 0.025 to 0.050 millimeters thick in total, are cut to a size slightly larger than the ultimate actuator package dimensions. The copper side of the film is masked and patterned to form the desired shape of electrodes for contacting a piezo element together with conductive leads and any desired lands or access terminals.

A pitchfork electrode pattern is shown, having three tines which are positioned to contact the center and both sides of one face of a piezo element, but in other embodiments an H- or a comb-shape is used. The patterning may be done by masking, etching and then cleaning, as is familiar from circuit board or semiconductor processing technology. The masking is effected by photoresist patterning, screening, tape masking, or other suitable process. Each of these electroded pieces of polyimide film, like a classical printed circuit board, defines the positions of circuit elements or actuator sheets, and will be referred to below simply as a "flex circuit." However, methods and devices of the invention also contemplate using an electroded piezo element, an insulator, and electrical contacts, rather than a "flex circuit".

Next, uncured sheet epoxy material having approximately the same thickness or slightly thicker than the electrode foil layer is cut, optionally with through-apertures matching the electrode pattern to allow enhanced electrical contact when assembled, and is placed over each flex circuit, so it adheres to the flex circuit and forms a planarizing layer between and around the electroded portions. The backing is then removed from the epoxy layers attached to the flex circuits, and pre-cut spacers 120 are placed in position at corner and edges of the flex circuit. The spacers outline a frame which extends above the plane of the electrodes, and defines one or more recesses into which the piezo elements are to be fitted in subsequent assembly steps. The piezo element or elements are then placed in the recesses defined by the spacers, and a second electroded film 111, 112 with its own planarizing/bonding layer 114 is placed over the element in a position to form electrode contacts for the top of the piezo element. If the device is to have several layers of piezo elements, as would be the case for some bending actuator constructions, these assembly steps are repeated for each additional electroded film and piezoelectric plate, bearing in mind that a polyimide film which is clad and patterned on both sides may be used when forming an intermediate electrode layer that is to contact actuator elements both above and below the intermediate sheet.

Once all elements are in place, the completed sandwich assembly of patterned flex circuits, piezo sheets, spacers and curable patterned epoxy layers is placed in a press between heated platens, and is cured at an elevated temperature and pressure to harden the assembly into a stiff, crack-free actuator card. In a representative embodiment, a cure cycle of thirty minutes at 350° F. and 50–100 psi pressure is used. The epoxy is selected to have a curing temperature below the depoling temperature of the piezo elements, yet achieve a high degree of stiffness.

The above construction illustrates a simple actuator card having a single piezo plate sandwiched between two electroded films, so that the plate transfers shear strain efficiently through a thin film to the surface of the actuator card. The measure of transfer efficiency, given by the shear modulus divided by layer thickness squared, and referred to as gamma ($\Gamma$), depends on the moduli and thickness of the epoxy 114, the rolled foil electrodes 111, and the polyimide film 110. In a representative embodiment in which the epoxy and copper electrode layers are 1.4 mils thick and the epoxy has a modulus of $0.5 \times 10^6$, a gamma of approximately $9 \times 10^{10}$ pounds/inch$^4$ is achieved. Using a thinner epoxy layer and film with 0.8 mil foil, substantially higher $\Gamma$ is achieved. In general, the gamma of the electrode/epoxy layer is greater than $5 \times 10^{10}$ pounds/inch$^4$, while that of the film is greater than $2 \times 10^{10}$ pounds/inch$^4$.

It should be noted that using PZT actuator plates ten mils thick, a card having two PZT plates stacked over each other with three flex circuit electroded film layers (the middle one being double clad to contact both plates) has a total thickness of 28 mils, only forty percent greater than the plates alone. In terms of mass loading, the weight of the actuator elements represents 90% of the total weight of this assembly. Generally, the plates occupy fifty to seventy percent of the package thickness, and constitute seventy to ninety percent of its mass, in other constructions. Thus, the actuator itself allows near-theoretical performance modeling. This construction offers a high degree of versatility as well, for implementing benders (as just described) as well as stacks or arrays of single sheets.

Another useful performance index of the actuator constructed in accordance with the present invention is the high ratio of actuator strain $\epsilon$ to the free piezo element strain $\Lambda$, which is approximately (0.8) for the two layer embodiment described herein, and in general is greater than (0.5). Similarly, the ratio of package to free element curvatures, K, is approximately 0.85–0.90 for the described constructions, and in general is greater than 0.7.

Thus, overall, the packaging involved in constructing a piezo element embedded in a flex circuit impairs its weight and electromechanical operating characteristics by well under 50%, and as little as 10%, while profoundly enhancing its hardiness and mechanical operating range in other important respects. For example, while the addition of sheet packaging structure to the base element would appear to decrease attainable K, in practical use the flex card construction results in piezo bender constructions wherein much greater total deflection may be achieved, since large plate structures may be fabricated and high curvature may be repeatedly actuated, without crack failure or other mechanical failure modes arising. Several Figures will illustrate the variety of constructions to which such enhanced physical characteristics are brought.

Figure 2C:
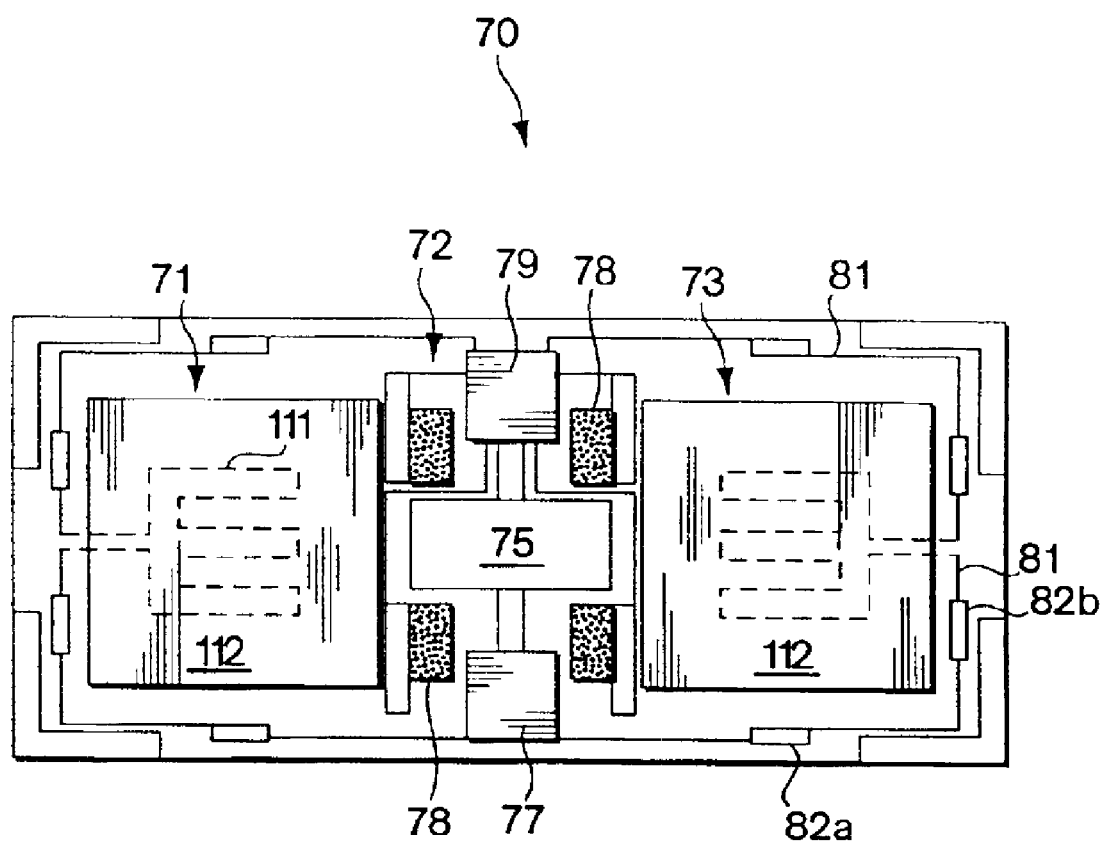
FIG. 2C illustrates an actuator or sensor card with circuit elements.

First, the structure of an electroactive element embedded between flex circuits not only provides a low mass unified mechanical structure with predictable response characteristics, but also allows the incorporation of circuit elements into or onto the actuator card. FIG. 2C shows a top view of one device 70 of this type, wherein regions 71, 73 each contain broad electroactive sheets, while a central region 72 contains circuit or power elements, including a battery 75, a planar power amplification or set of amplifiers 77, a microprocessor 79, and a plurality of strain gauges 78. Other circuit elements 82a, 82b may be located elsewhere along the path of circuit conductors 81 about the periphery. As with the other embodiments, spacers 120 define layout and seal edges of the device, while electrodes 111 attach the electroactive elements to the processing or control circuitry which is now built-in. The circuit elements 82a, 82b may comprise weighting resistors if the device is operated as a sensor, or shunting resistors to implement passive damping control. Alternatively, they may be filtering, amplifying, impedance matching or storage elements, such as capacitors, amplifiers or the like. In any case, these elements also are located away from electroactive plates 84. The components collectively may sense strain and implement various patterns of actuation in response to sensed conditions, or perform other sensing or control tasks.

Figure 3:
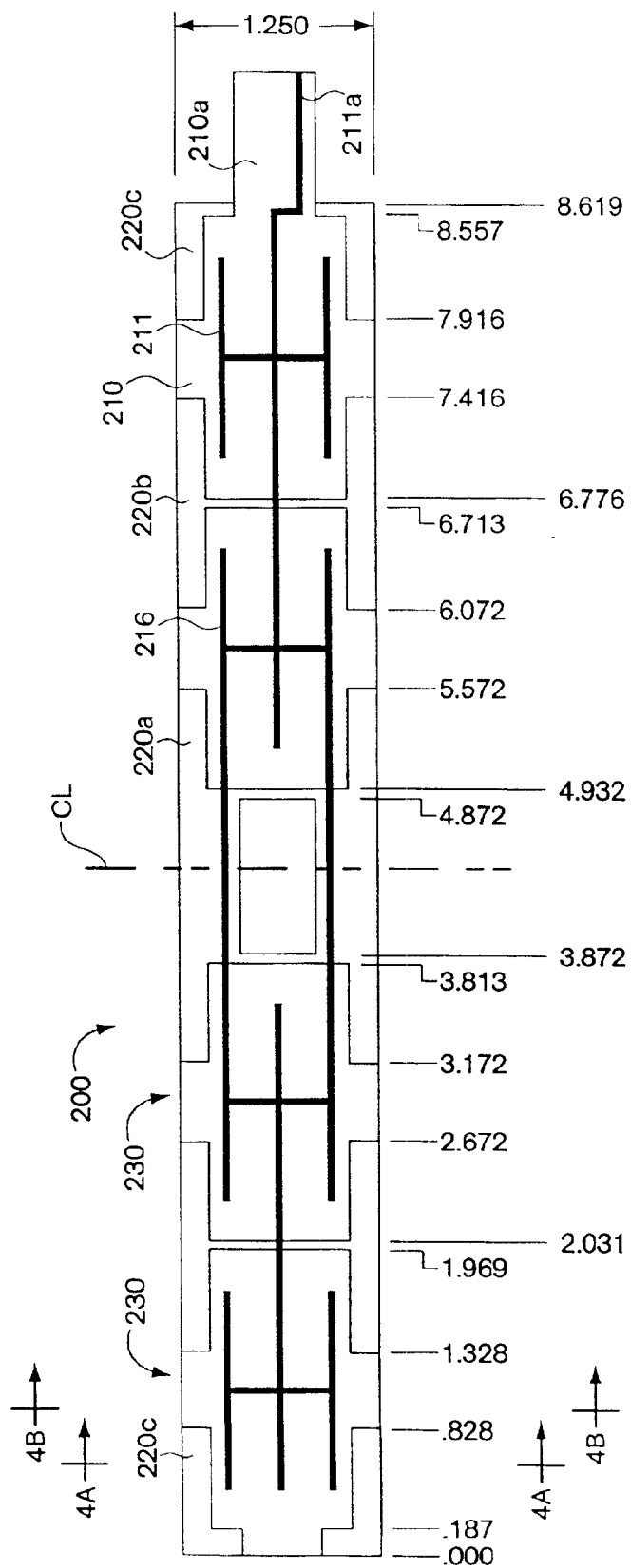
FIG. 3 illustrates another card.

Returning now to the actuator aspect of the invention, FIG. 3 shows a top view of an actuator package 200 having dimensions of about 1.25×9.00×0.30 inches and assembled with two layers of piezoelectric plates of four plates each. A rectangular polyimide sheet 210 with an end tab 210a carries an electrode 211 in the form of a lattice of H-shaped thin copper lines interconnected to each other and to a single runner 211a that leads out to the tab, thus providing a low impedance connection directly to each of four rectangular regions which hold the piezo plates.

Spacer elements 220a, 220b of H-shape, or 220c of L-shape mark off corners and delineate the rectangular spaces for location of the piezo plates 216. In this embodiment, a plurality of gaps 230, discussed further below, appear between adjacent the H- or L-spacers. As will be apparent from the description below, the use of these small discrete spacer elements (I-, T- or O-shaped spacers may also be convenient) is enhanced because they may be readily placed on the tacky bonding epoxy layer 114 during assembly to mark out assembly positions and form a receiving recess for the piezo elements. However, the spacer structure is not limited to such a collection of discrete elements, but may be a single or couple of frame pieces, formed as a punched-out sheet or molded frame, to provide all, or one or more, orienting and/or sealing edges, or recesses for holding actuation of circuit components.

FIG. 5 illustrates a top view of each of the three sheet, electrode and piezo plate layers separately, while FIG. 5A illustrates the general layering sequence of the film, conductor, and spacer/piezo layers. As shown, the spacers 220 and piezo plates 216 constitute a single layer between each pair of electrode layers.

Figure 4B:
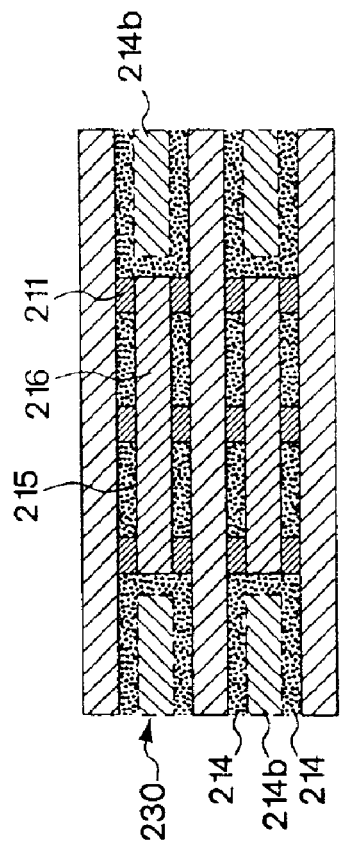
FIGS. 4A and 4B show sections through the card of FIG. 3.
Figure 4A:
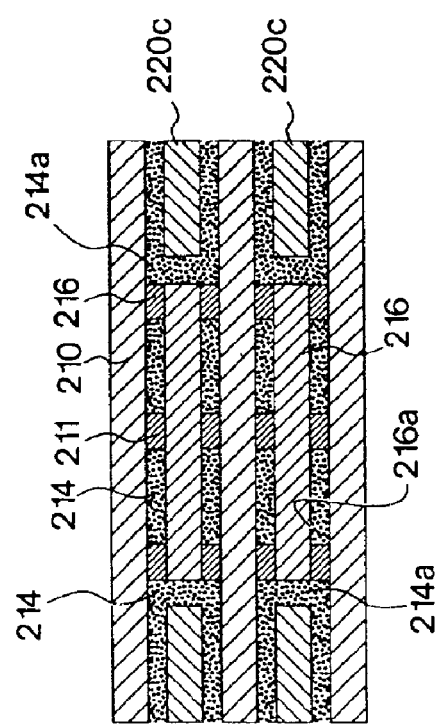

FIGS. 4A and 4B (not drawn to scale) illustrate the layer structure of the assembled actuator along the vertical sections at the positions indicated by "A" and "B" in FIG. 3. As more clearly shown in FIG. 4A, a patterned bonding layer of epoxy sheet 214 is coplanar with each electrode layer 211 and fills the space between electrodes, while the spacer 220c is coplanar with the piezo plate 216 and substantially the same thickness as the plate or slightly thicker. Illustratively, the piezo plate 216 is a PZT-5A ceramic plate, available commercially in a five to twenty mil thickness, and has a continuous conductive layer 216a covering each face for contacting the electrodes 211. The spacers 220 are formed of somewhat compressible plastic with a softening temperature of about 250° C. This allows a fair degree of conformability at the cure temperature so the spacer material may fill slight voids 214a (FIG. 4A) during the assembly process. As shown in FIG. 4B, the gaps 230 (when provided) between spacers result in openings 214b which vent excess epoxy from the curable bonding layers 214, and fill with epoxy during the cure process. As illustrated in that FIGURE, a certain amount of epoxy also bleeds over into patches of film 215 between the electrodes 211 and the piezo plate 216. Because of the large and continuous extent of electrode 211, this patchy leakage of epoxy does not impair the electrical contact with the piezo elements, and the additional structural connection it provides helps prevent electrode delamination.

It will be appreciated that with the illustrated arrangements of electrodes, each vertically stacked pair of piezo plates may be actuated in opposition to each other to induce bending, or more numerous separate electrodes may be provided to allow different pairs of plates to be actuated in different ways. In general, as noted above, the invention contemplates even quite complex systems involving many separate elements actuated in different ways, with sensing, control, and power or damping elements all mounted on the same card. In this regard, great flexibility in adapting the card to practical tasks is further provided by its flexibility. In general, it has a supple flexibility comparable to that of an epoxy strip thirty mils thick, so that it may be bent, struck or vibrated without damage. It may also be sharply bent or curved in the region of its center line CL (FIG. 3) where no piezo elements are encased, to conform to an attaching surface or corner. The elements may be poled to change dimension in-plane or cross-plane, and the actuators may therefore be attached to transmit strain to an adjacent surface in a manner effective to perform any of the above-described control actions, or to launch particular waveforms or types of acoustic energy, such as flexural, shear or compressional waves into an adjacent surface.

Figure 6:
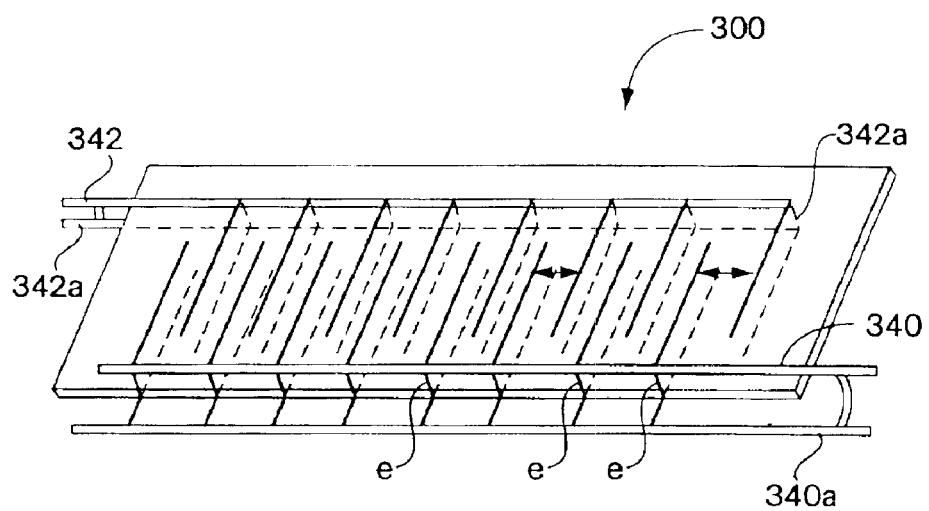
FIG. 6 shows an actuator package with comb electrodes for in-plane actuation.

FIG. 6 shows another actuator embodiment 300. In this embodiment, illustrated schematically, the epoxy bonding layer, film and spacer elements are not shown, but only electrode and piezo sheets are illustrated to convey the operative mechanisms. A first set of electrodes 340 and second set 342 are both provided in the same layer, each having the shape of a comb with the two combs interdigitated so that an electrical actuation field is set up between the tooth of one comb and an adjacent tooth of the other comb. In FIG. 6, a parallel pair of combs 340a, 342a is provided on the other side of the piezo sheet, with comb electrode 340 tied to 340a, and comb electrode 342 tied to 342a, so as to set up an electric field with equipotential lines "e" extending through the piezo sheet, and in-plane potential gradient between each pair of teeth from different combs. In the embodiment shown, the piezoceramic plates are not metallized, so direct electrical contact is made between each comb and the plate. The plates are poled in-plane, by initially applying a high voltage across the combs to create a field strength above one two thousand volts per inch directed along the in-plane direction. This orients the piezo structure so that subsequent application of a potential difference across the two-comb electrodes results in in-plane (shear) actuation. Thus, the direct contact of interdigital electrodes provides to the piezo element an electrical field which is generally parallel to the actuation direction.

Figure 7:
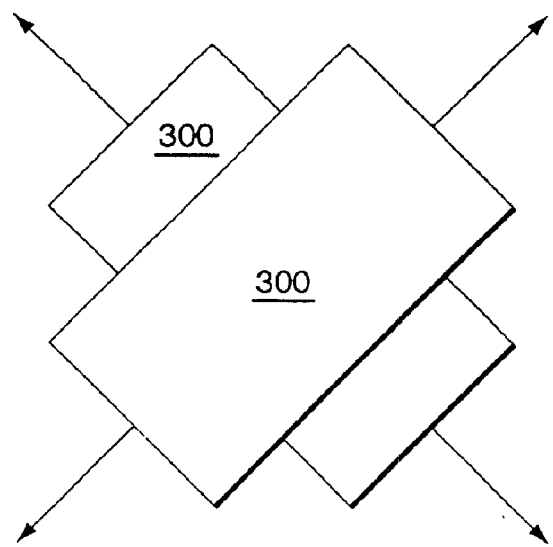
FIG. 7 illustrates a torsional actuator package using the cards of FIG. 6.

In addition to shear actuation, directional actuation and damping may be effected using methods or devices of the invention. For example, as shown in FIG. 7, two such actuators 300 may be crossed to provide torsional actuation.

Figure 8A:
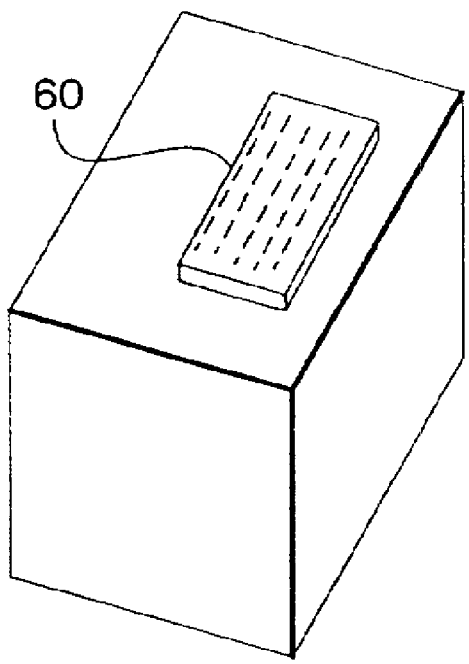
FIGS. 8A and 8B show actuators mounted as surface mount actuators on a surface or rod, respectively.
Figure 8B:
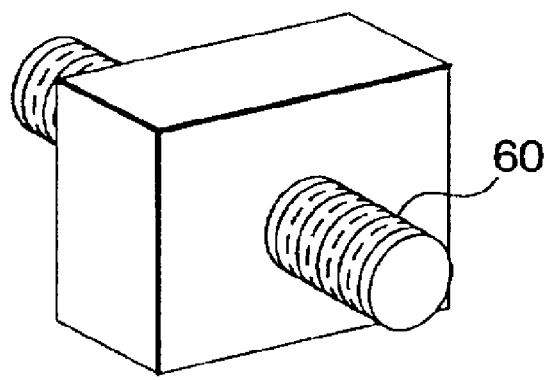

In discussing the embodiments above, the direct transfer of strain energy through the electrode/polyimide layer to any adjoining structure has been identified as a distinct and novel advantage. Such operation may be useful for actuation tasks or diverse as airfoil shape control actuation and noise or vibration cancellation or control. FIGS. 8A and 8B illustrates typical installations of flat (FIG. 8A) and hemicylindrical (FIG. 8B) embodiments 60 of the actuator, applied to a flat or slightly curved surface, and a shaft, respectively.

Figure 9A:
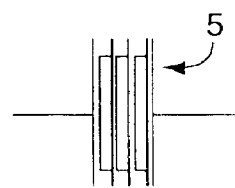
FIG. 9 shows actuators mounted as mechanical elements.

However, while the electromechanical materials of these actuators operate by strain energy conversion, applications of the present invention extend beyond strain-coupling through the actuator surface, and include numerous specialized mechanical constructions in which the motion, torque or force applied by the actuator as a whole is utilized. In each of these embodiments, the basic strip- or shell-shaped sealed actuator is employed as a robust, springy mechanical element, pinned or connected at one or more points along its length. As shown in FIG. 9, when electrically actuated, the strip then functions, alone or with other elements, as a self-moving lever, flap, leaf spring, stack or bellows. In the diagrams of FIGS. 9(a)–9(q), the elements A, A', A" ... are strip or sheet actuators such as shown in the above FIGURES, while small triangles indicate fixed or pinned positions which correspond, for example, to rigid mounting points or points of connection to a structure. Arrows indicate a direction of movement or actuation or the contact point for such actuation, while L indicates a lever attached to the actuator and S indicates a stack element or actuator.

Figure 9B:
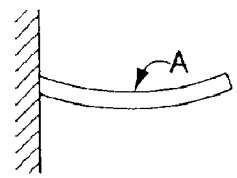
Figure 9C:
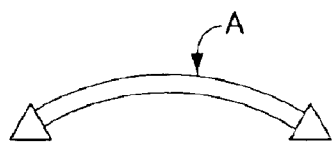

The configurations of FIGS. 9(a)–9(c) as stacks, benders, or pinned benders may replace many conventional actuators.

Figure 9D:
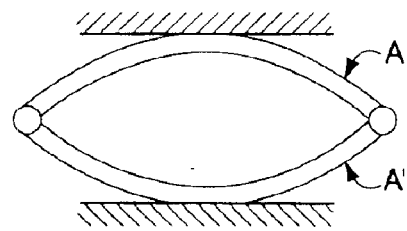
Figure 9E:
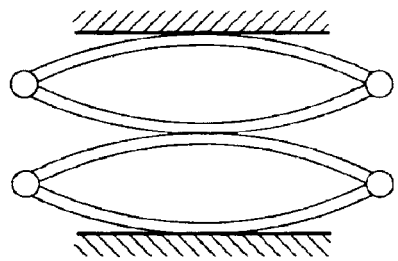
Figure 9F:
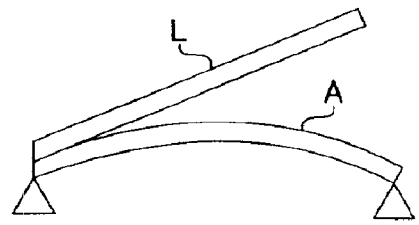
Figure 9G:
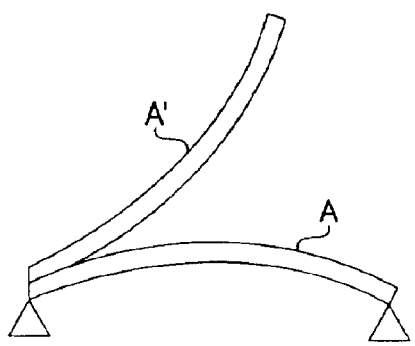
Figure 9H:
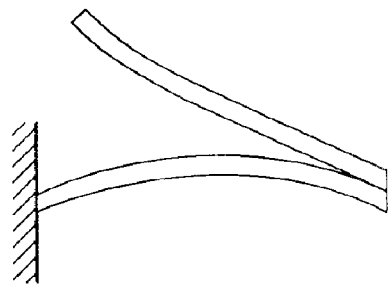
Figure 9I:
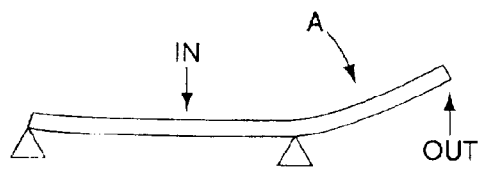
Figure 9J:
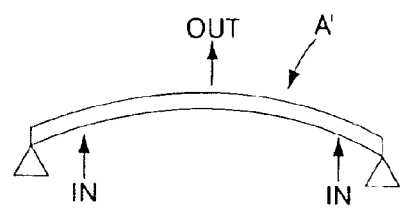
Figure 9K:
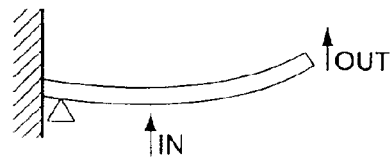
Figure 9L:
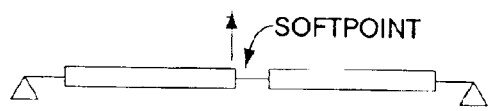
Figure 9M:
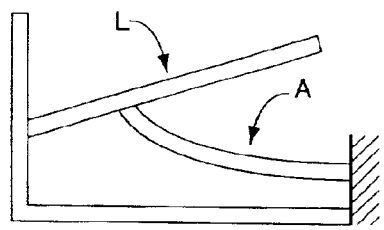
Figure 9N:
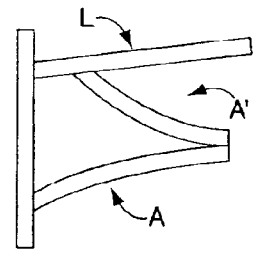
Figure 9O:
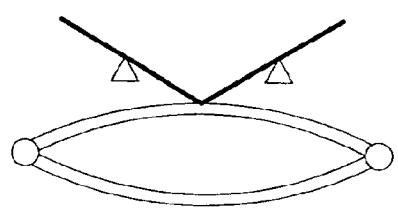
Figure 9P:
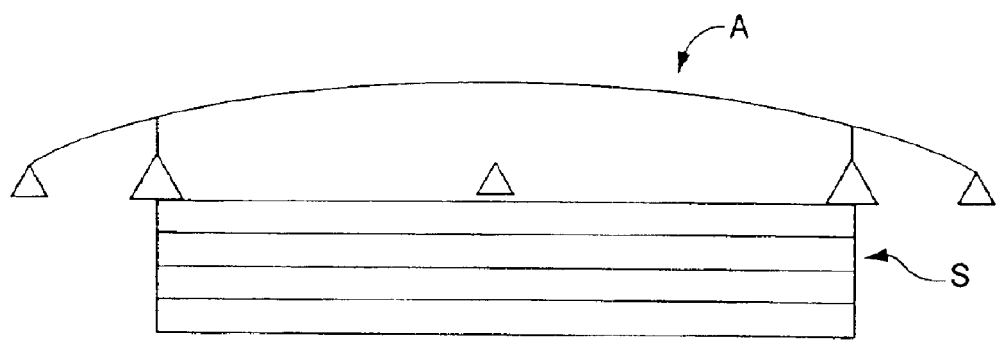
Figure 9Q:
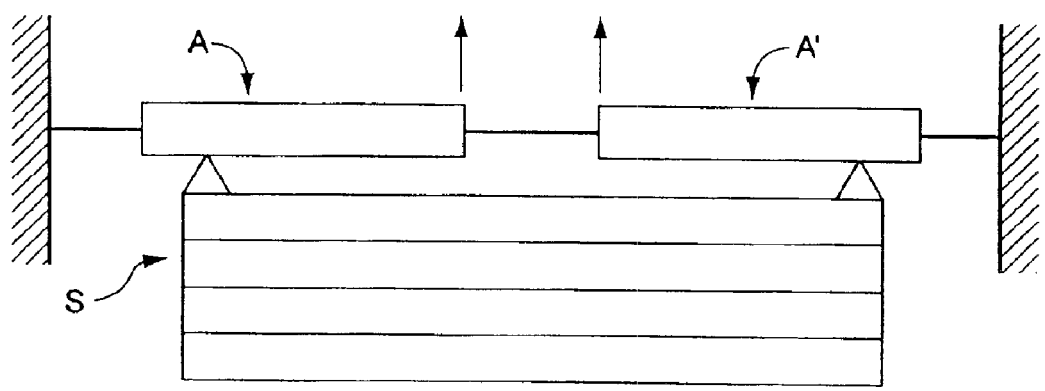

For example, a cantilevered beam may carry a stylus to provide highly controlled single-axis displacement to constitute a highly linear, large displacement positioning mechanism of a pen plotter. Especially interesting mechanical properties and actuation characteristics are expected from multi-element configurations 9(d) et seq., which capitalize on the actuators having a sheet extent and being mechanically robust. Thus, as shown in FIGS. 9(d) and (e), a pin-pin bellows configuration may be useful for extended and precise one-axis Z-movement positioning, by simple face-contacting movement, for applications such as camera focusing; or may be useful for implementing a peristalsis-type pump by utilizing the movement of the entire face bearing against a fluid. As noted in connection with FIG. 3, the flex circuit is highly compliant, so hinged or folded edges may be implemented by simply folding along positions such as the centerline in FIG. 3, allowing a closed bellows assembly to be made with small number of large, multi-element actuator units. The flex circuit construction allows strips or checkerboards of actuator elements to be laid out with fold lines between each adjacent pair of elements, and the fold lines may be impressed with a thin profile by using a contoured (e.g. waffle-iron) press platen during the cure stage. With such a construction, an entire seamless bellows or other folded actuator may be made from a single flex circuit assembly.

As noted above, the piezo element need not be a stiff ceramic element, and if the flex circuit is to be used only as a sensor, then either a ceramic element, or a soft material such as PVDF may be employed. In the case of the polymer, a thinner more pliant low temperature adhesive is used for coupling the element, rather than a hard curable epoxy bonding layer.

Certain embodiments of the invention are exemplified below.

EXAMPLE 1

In this example, a vibration control system was designed to determine certain parameters of functional requirements of a gantry active control system. The functional requirements defined included (but were not limited to) the following:

Accuracy

Settling time

Mass, size and location of the actuators and sensors

Power

Peak strains

Lifetime

Temperature range

Exposure to humidity and solvents

Cost

Interfaces with existing gantry control system

In order to gather data on the structural response of a gantry during operation, the gantry was equipped with an array of piezoelectric strain sensors and accelerometers. Placement and sizing of the piezoelectric actuators required accurate strain mode shape information, which were obtained from this data, and were compared to the Finite Element Model ("FEM"). One important piece of information obtained in this phase of the project involved the effect of different head positions on the dynamics. Both the actuator design and any control software design depended on when the vibration control was applied, i.e., while the head was moving along the gantry, and/or after it had stopped at an arbitrary position on the gantry.

Data was acquired both with and without a friction block in place, to allow at least analytical evaluation of the potential for complete replacement of the friction block by the electroactive vibration control system.

Using the data acquired above, along with finite element modeling information, the system-level design was performed. This design involved selecting a system architecture, including actuator placement, type of sensor, and the type of control algorithm. As discussed above, with the moving head having a significant effect on the gantry dynamics, the electroactive vibration control system's effectiveness was improved by making the trajectory information available in the motion control system. This information may be relayed to the motion control system with a simple clip lead attached to the proper point in the motion controller's circuitry. For example, information such as the plots of motor current, which is often easily accessible, may be provided to the vibration control system.

After selecting the system architecture, an analytical "input/output" model of the system was developed, to design the control algorithm for vibration control, and to simulate its performance. The system design was compared to the functional requirements, to ensure compliance. This analysis served to define the specifications on the various components of the control system, especially the analog sensor signal conditioning electronics, the digital signal processor (DSP) based control unit, and the power amplifier used to provide the necessary voltage and current to the electroactive actuators.

Each of the components of the electroactive vibration control system were then designed, including the various electronic components. The electroactive actuators themselves were fabricated using methods disclosed herein. Each actuator was tested using standard quality control methods. All electronics were fabricated and tested for functionality and for compliance with the specifications devised in the system design task.

An important aspect of the design involved the integration of the actuators and sensors with the gantry. For example, for a given gantry, a 0.5 mm actuator thickness may be determined to not likely interfere with motion of the head along the gantry. The types of cable used to connect the actuators and sensor on the gantry to the electronic equipment were then determined.

Figure 10:
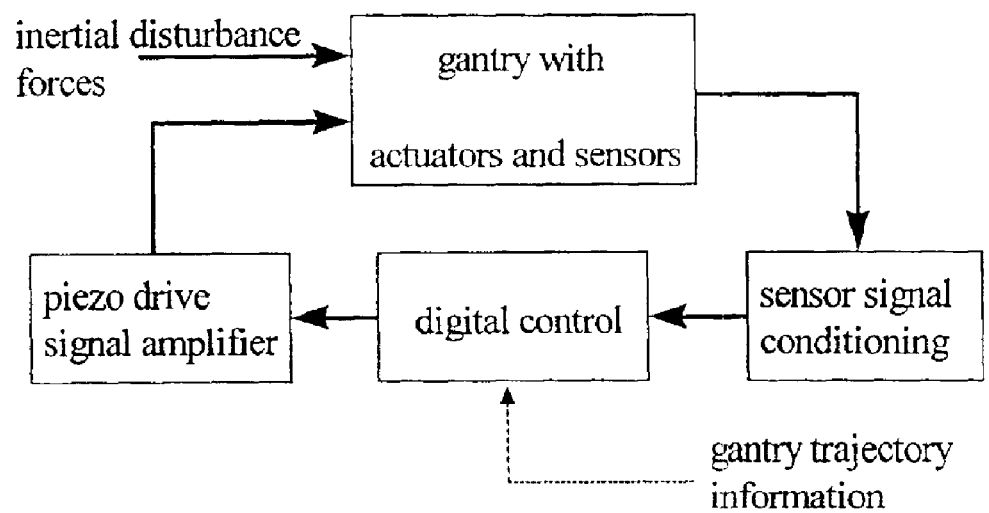
FIG. 10 shows a block diagram of an embodiment of an electroactive vibration control system for a gantry.

In this particular example, the gantry of an automated SMT electronics collect and place equipment was equipped with actuators, sensors and electronics, and analyzed using an FEM with plate elements. The basic concept, shown in block diagram in FIG. 10, includes electroactive strain actuators and sensors bonded to the gantry, along with the necessary power, signal, and digital control electronics to achieve vibration reduction. For the purposes of this study, the head was assumed to be fixed at the end of the gantry. The installation of actuators was done using a vacuum-bonding procedure.

Figure 13:
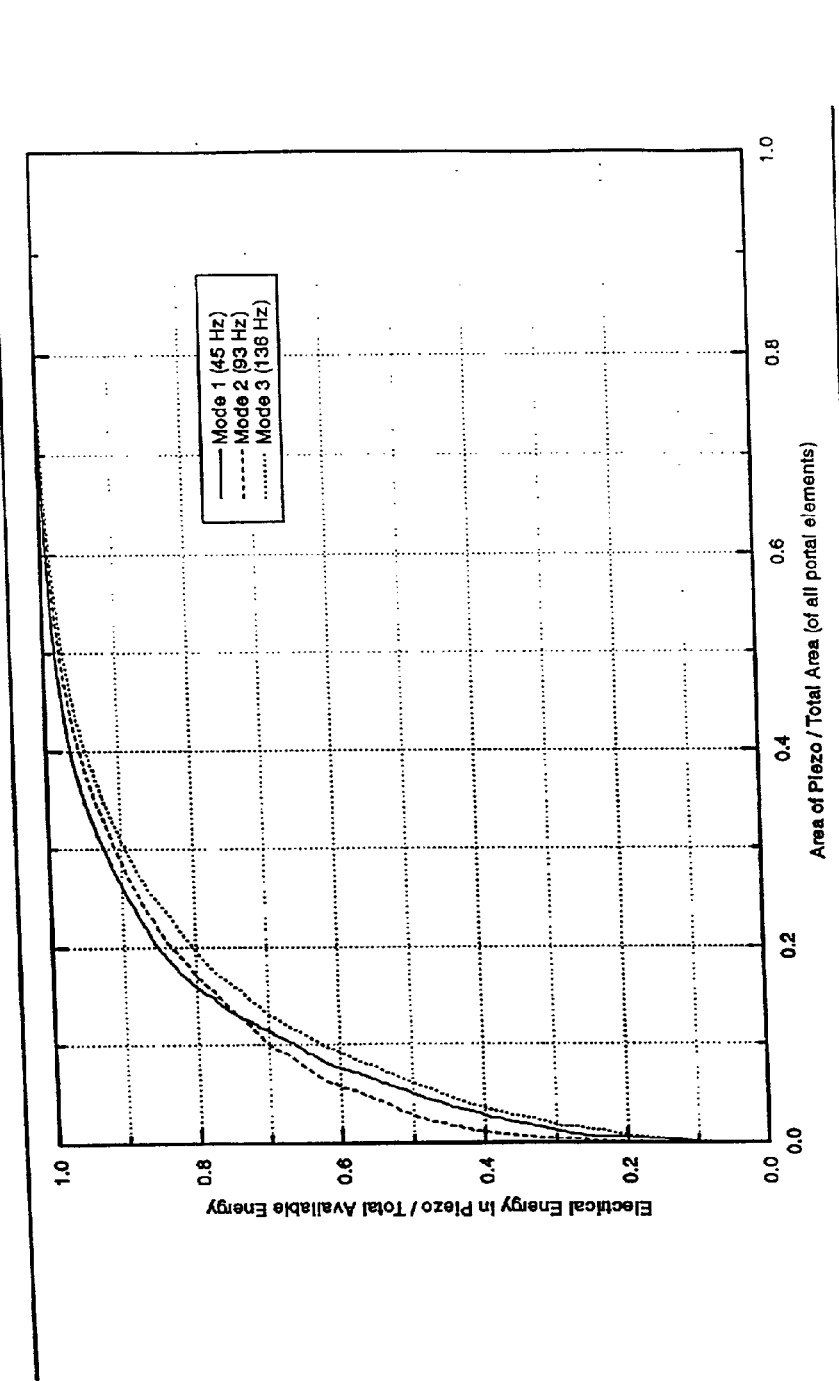
FIG. 13 shows extensional strain energy concentration.

"Open loop" testing was then performed. Open loop testing involves injecting signals into the actuators and measuring the response of the gantry to confirm experimentally the analytical modeling done earlier in this study. This testing was performed with the gantry and head stationary, as well as moving along some "standard" trajectories. The signal(s) to be passed from the gantry and head motion controller to the vibration control system were measured as well during these tests. The electoactive actuators were distributed over 10% of the surface area of the gantry having the maximum strain energy in the first natural mode of vibration. The effectiveness of the actuator distribution at exciting the first three modes of vibration was modeled using design software. Between 80–84% of all strain energy is in the plate elements; and between 62–75% of the plates' energy is extensional strain, and therefore available for capture by electroactive control devices bonded to the surface. Thus, at least 52% of the strain energy in a mode is available. Some of this energy is in the frame/support for the moving head. As shown in FIG. 13, the extensional strain energy was sorted to maximize performance for a given amount of electroactive element.

Damping was added to the structural model. Plots of acceleration versus time at the head, after impact by a hammer, showed roughly 5% of critical damping in the first mode with the friction block in place.

Feedback control was designed using the standard Linear Quadratic Regulator (LQR) approach, ensuring that piezoelectric actuation control voltages did not exceed the actuator device limits. Actuation voltages in the closed feedback loop are proportional to the input disturbance forces associated with the motion of the gantry. Here, the gantry was assumed to accelerate in the y-direction (transverse to the gantry axis) at a constant 25 m/s$^2$ until maximum velocity of 3 m/s was reached. The D'Alembert inertial force associated with a 10 kg mass was applied at the center of gravity of the head. This mass included the 5 kg head mass, plus 5 kg of effective gantry mass.

Figure 11:
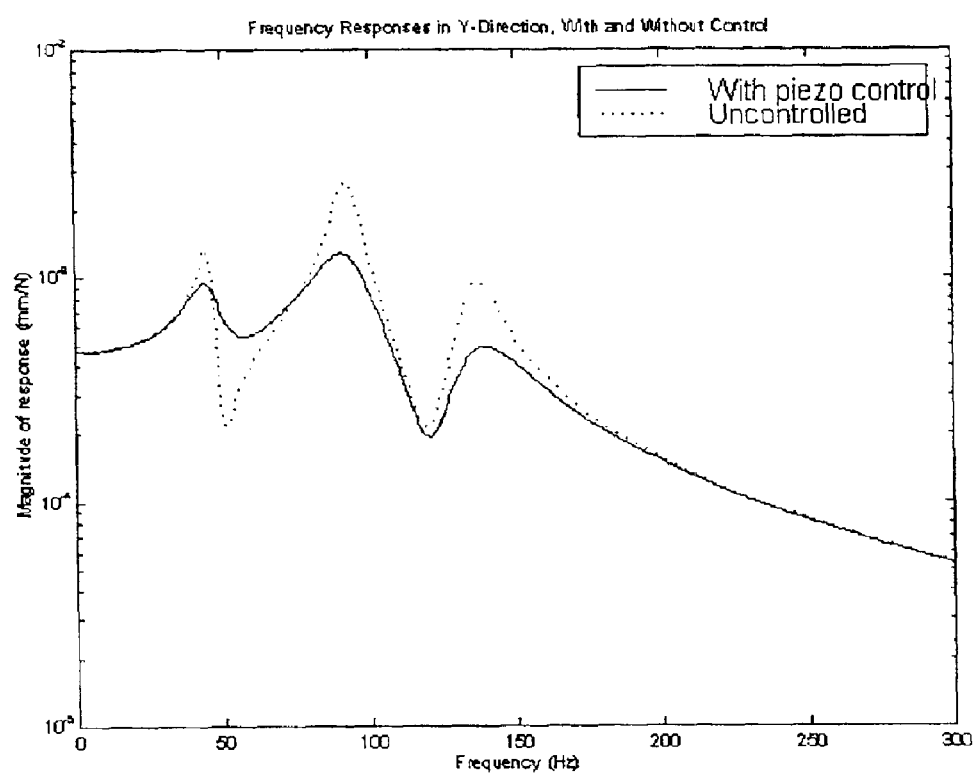
FIG. 11 shows a simulated frequency response on a collect and place head at the tip of a gantry, without and with electroactive vibration control.
Figure 12:
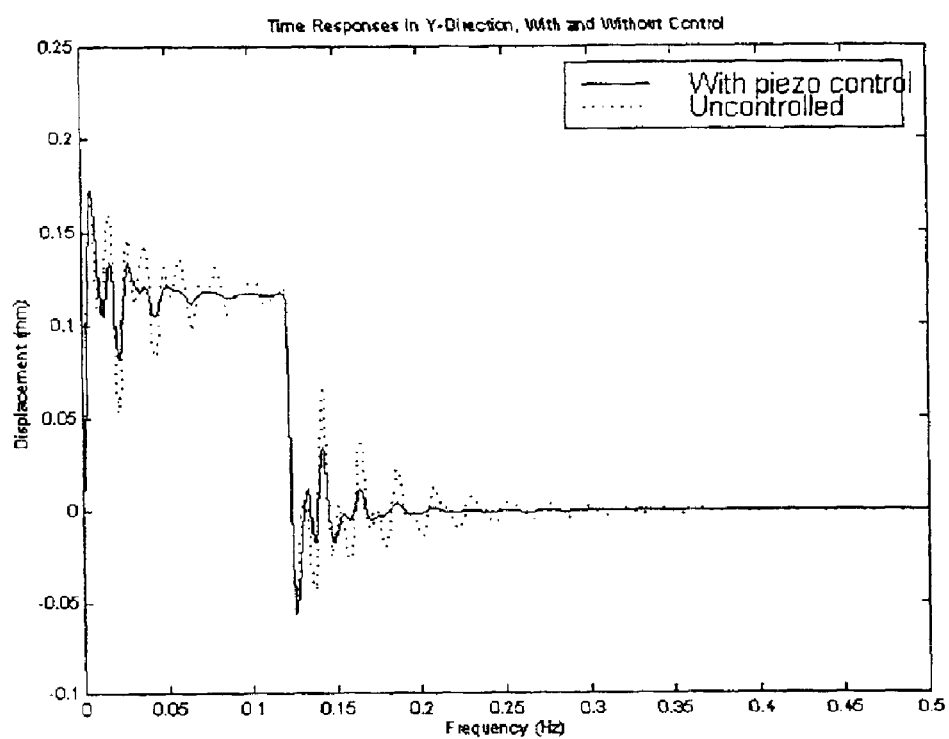
FIG. 12 shows the simulated time response of a collect and place head without and with electroactive control.

The improvements in damping and settling time were then determined after simulating the vibration-controlled system's frequency and time domain responses. Frequency responses are simulated in FIG. 11, measured at a point on the underside of the pick and place head, in the y-direction. The reduction in dynamic response to a unit input force is evident in this figure. As shown in FIG. 11, as well as Table I, mode 1 closed loop damping was about 12%, mode 2 closed loop damping was about 11%, and mode 3 closed loop damping was about 10%. Time responses at the same point, in the same direction, are simulated in FIG. 12. This simulation shows a dramatic reduction in settling time with the electroactive control. Thus, very effective control can be achieved with very little additional mass.

TABLE I

Gantry structural dynamic parameters.

| Mode | Description | Frequency (Hz) | Inherent Damping Ratio (% of critical) | Damping Ratio with Piezo Control (%) |
| --- | --- | --- | --- | --- |
| 1 | Twisting about gantry axis | 46 | 5 | 12 |
| 2 | Bending in xy (scanning) plane | 93 | 5 | 11 |
| 3 | Coupled bend/twist | 136 | 5 | 10 |

The gantry/head structural dynamic properties, from FEM, are shown in Table I. The representative actuator distribution designed here was 0.5 mm thick, with an area of 330 cm$^2$, and a mass of less than 100 g. The closed loop modal damping, also shown in Table I, was at least twice the assumed 5% value inherent to the gantry with the friction block, for all three modes of vibration included in the analysis. Thus, the vibration amplitude and settling time were significantly reduced.

Figure 14:
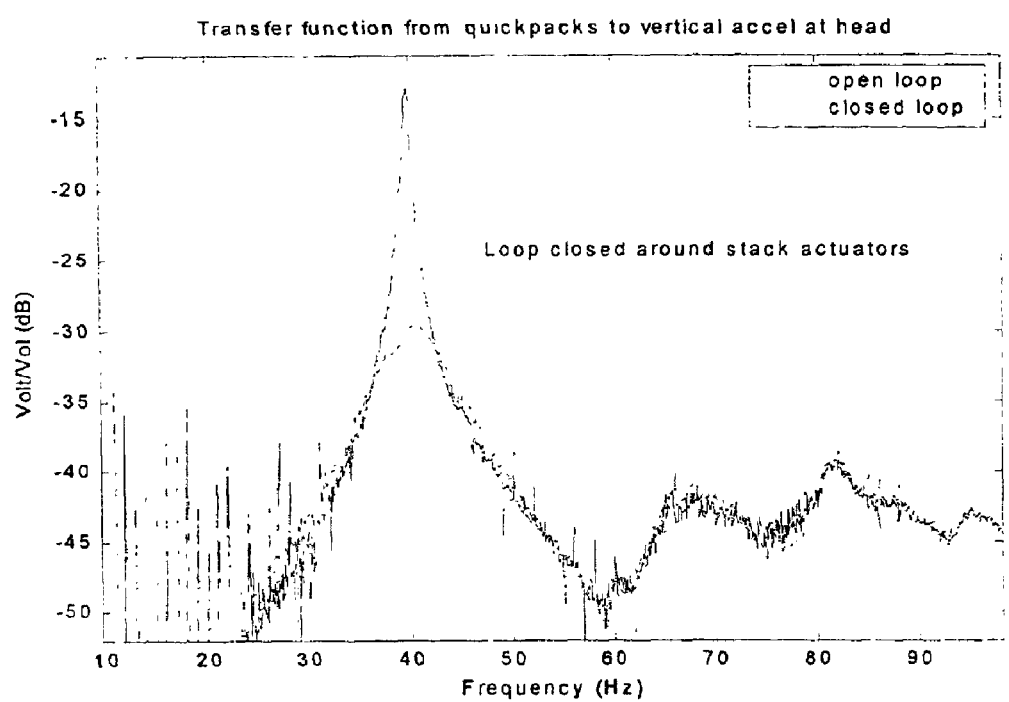
FIG. 14 shows the results of a closed loop test on the frequency response of a pick and place machine having a vibration control system in accordance with the invention.
Figure 15:
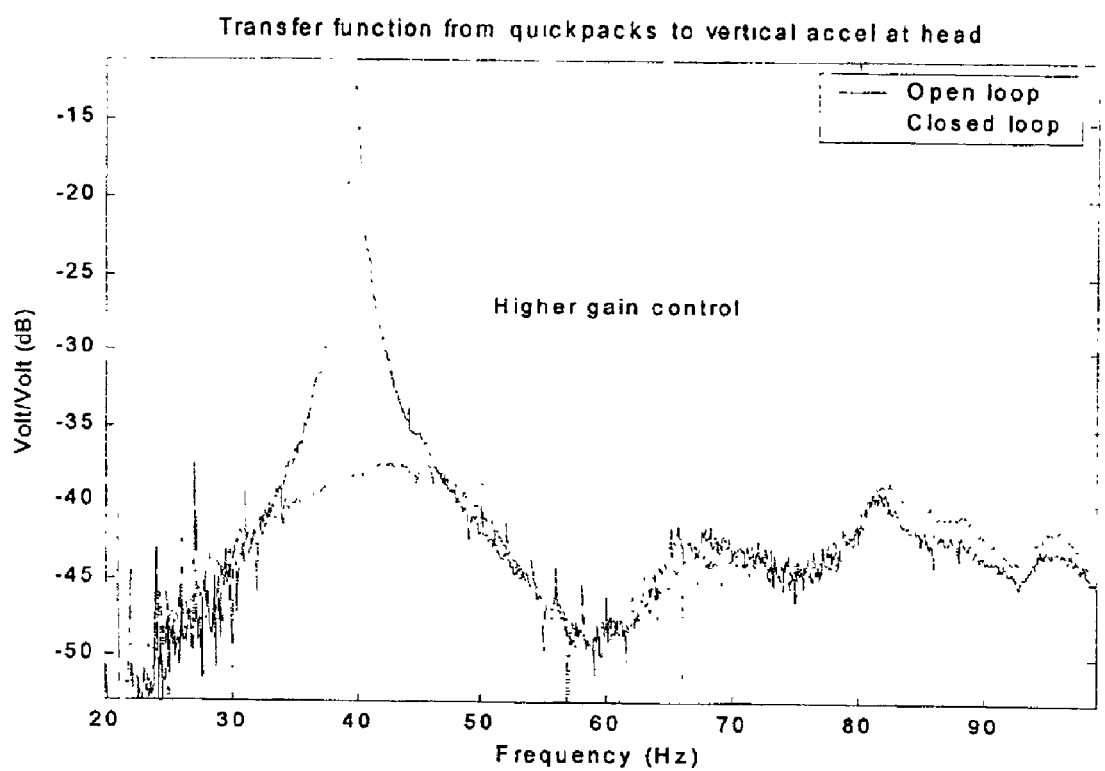
FIG. 15 shows the results of a closed loop test on the gain control of a pick and place machine having a vibration control system in accordance with the invention.

As shown in FIGS. 14 and 15, the vibration control system induced changes in the frequency response and gain control. In this study, the damping was increased by over one order of magnitude. This increase corresponds to an increase in placement accuracy of a factor of ten.

Following the open loop tests, the data was analyzed and the final control algorithm design was performed. If necessary, the actuator and sensor hardware may be modified to ensure compliance with the functional requirements. Then, "closed loop" testing of the final electroactive vibration control system may be performed. Closed loop testing is generally when actuators are driven at least in part by signals generated by sensors.

This study demonstrated that effective active electroactive vibration control of the gantry is possible.

EXAMPLE 2

Figure 16:
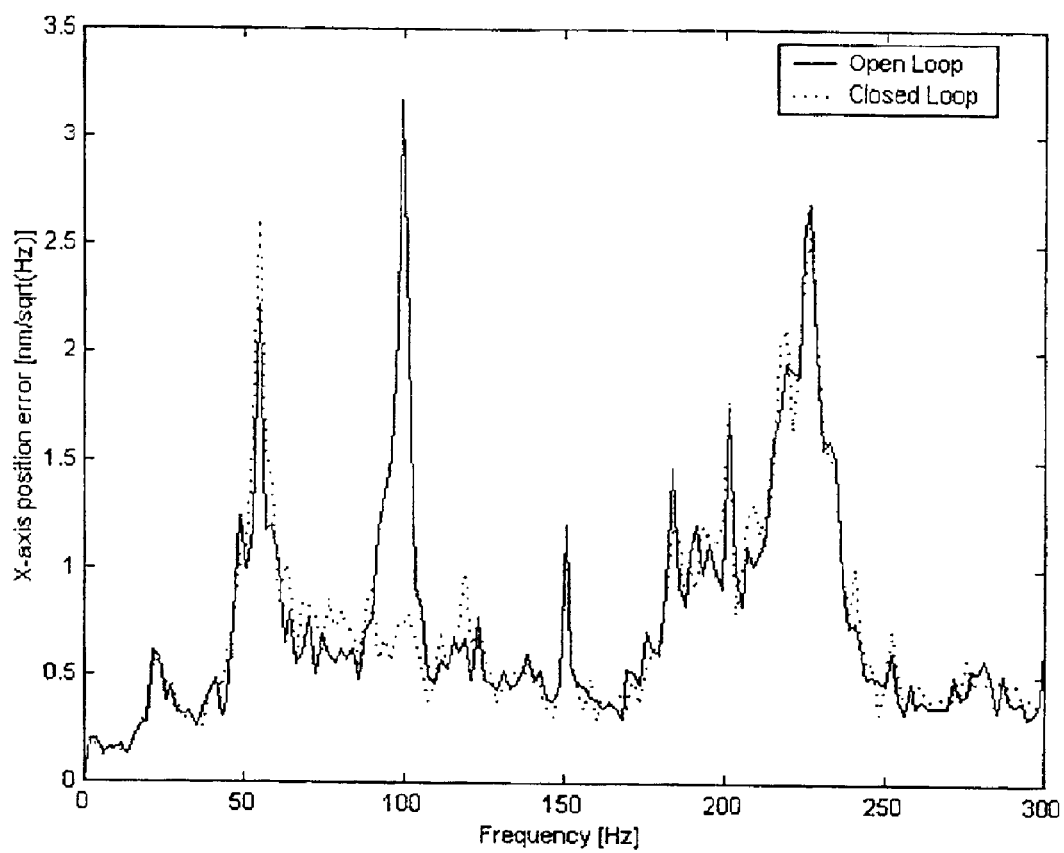
FIG. 16 shows the power spectral density of error signals recorded by a laser metrology system in a lithography machine.

A vibration control system in accordance with the invention was used in a lithography machine. As shown in FIG. 16, which shows the power spectral density of error signals recorded by a laser metrology system, use of the vibration control system resulted in a three-fold reduction in system response in the band from 75 to 125 Hz. The reduction in the peak using the vibration control system would be expected to reduce the system image blur by a factor of two–three after conventional methods are used to reduce peaks at 50 Hz and 225 Hz. Alternatively, in some cases, the vibration control system might be used to reduce the peaks at 50 Hz or 225 Hz or at other levels. Reducing the image blur allows the fabrication system to produce finer trace dimensions and feature sizes and improves the accuracy of the feature placement The foregoing description of embodiments and examples of the present invention are presented to demonstrate the range of constructions to which the invention applies. Those skilled in the art will appreciate that many other modifications and variations of the invention as set forth hereinabove may be made without departing from the spirit and scope thereof.

What is claimed is:

1. A vibration control system for use with a fabricating system, said vibration control system comprising:
   an actuator assembly for controlling vibration;
   said actuator assembly comprising
   (a) an electroactive element;
   (b) a conductor; and
   (c) an insulator;
   wherein said electroactive element, said conductor, and said insulator are bonded together such that in-plane strain in said electroactive element is shear-coupled between said electroactive element and said insulator;
   a sensor for detecting at least one parameter of displacement of said fabricating system and producing a signal in response thereto; and
   a circuit in electrical communication with said actuator assembly and said sensor;
   wherein, upon the detection of said at least one parameter of displacement by said sensor, said sensor signals said circuit, which, in response, activates said actuator assembly to control vibration.

2. The vibration control system of claim 1, said actuator assembly comprising an actuator selected from the group consisting of a strain actuator, an electroactive strain actuator, a piezoelectric strain actuator, and an electroactive stack actuator.

3. The vibration control system of claim 1, said actuator assembly comprising at least two actuators.

4. The vibration control system of claim 1, said sensor being selected from the group consisting of a strain sensor, an accelerometer, a laser displacement sensor, and a laser interferometer.

5. The vibration control system of claim 1, said sensor comprising at least two sensors.

6. The vibration control system of claim 5, said at least two sensors being capable of producing at least two different signals.

7. The vibration control system of claim 6, wherein said circuit interprets said at least two different signals as the sum difference between the two different signals.

8. The vibration control system of claim 1, wherein said fabricating system is a system for fabricating electronic components, the components being selected from the group consisting of semiconductor chips, printed circuit boards, liquid crystal displays, and thin film devices.

9. The vibration control system of claim 1, wherein said actuator assembly controls vibration of the fabricating system thereby increasing the accuracy of the system for fabricating electronic components.

10. The vibration control system of claim 9, wherein said actuator assembly controls vibration of the fabricating system thereby increasing fabrication throughput of the system for fabricating electronic components.

11. The vibration control system of claim 1, wherein said fabricating system is selected from the group consisting of a pick and place system, a lithography system, and a liquid crystal display manufacturing system.

12. The vibration control system of claim 1, wherein said fabricating system is a system for fabricating electronic components, and wherein the vibration is produced from a disturbance external the system for fabricating electronic components.

13. The vibration control system of claim 1, wherein said fabricating system is a system for fabricating electronic components, and wherein the vibration is produced from a disturbance internal to the system for fabricating electronic components.

14. The vibration control system of claim 13, wherein said fabricating system comprises a part selected from a group consisting of a step motor, a DC motor, a hydraulic actuator, and a pneumatic actuator, and wherein said vibration is caused by said part.

15. The vibration control system of claim 1, wherein said fabricating system is a system for fabricating electronic components comprising a lens assembly, a wafer stage, and a support structure for supporting the lens assembly and the wafer stage.

16. The vibration control system of claim 15, wherein said sensor detects displacement of the lens assembly relative to the wafer stage, and signals the circuit which, in response, signals said actuator assembly such that said actuator assembly decreases said displacement.

17. The vibration control system of claim 15, said vibration control system being secured to said support structure.

18. The vibration control system of claim 15, wherein said actuator assembly controls vibration in said support structure,
wherein, upon the detection of said at least one parameter of displacement by said sensor, said sensor signals said circuit, which, in response, activities said actuator assembly to control vibration.

19. The vibration control system of claim 1, wherein said actuator assembly is detachably secured within the vibration control system.

20. The vibration control system of claim 1, said vibration control system further comprising an electrical connection coupling said vibration control system to the fabricating system, and wherein said electrical communicates a signal to or from the vibration control system, said signal being selected from the group consisting of an able/disable signal, a system status signal, and a fault/error signal.

21. The vibration control system of claim 1, further comprising a control system having at least one controller that produces a signal, and which is in electrical communication with said circuit, and wherein said circuit activates said actuator assembly in response to the signal from the controller.

22. The vibration control system of claim 21, wherein said signal from said controller relates to linear displacement, auto-tuning, gain scheduling, external gain control, feed forward control, adaptive control, or feed back control.

23. The vibration control system for use with a fabricating system having a support structure, said vibration control system comprising:
an actuator assembly for controlling vibration;
said actuator assembly comprising
(a) an electroactive element;
(b) a conductor; and
(c) an insulator;
wherein said electroactive element, said conductor, and said insulator are bonded together such that in-plane strain in said electroactive element is shear-coupled between said electroactive element and said insulator; and
a sensor for detecting at least one parameter of displacement of said fabricating system and producing a signal in response thereto; and
a circuit in electrical communication with said actuator assembly and said sensor;
wherein, upon the detection of said at least one parameter of displacement by said sensor, said sensor signals said circuit, which, in response, activates said actuator assembly to control vibration in said support structure.

24. The fabricating system of claim 23, wherein said support structure supports a unitary part selected from the group consisting of a lens, a stage, and a gantry.

25. A fabricating system comprising:
an actuator assembly for controlling vibration;
said actuator assembly comprising
(a) an electroactive element;
(b) a conductor; and
(c) an insulator;
wherein said electroactive element, said conductor, and said insulator are bonded together such that in-plane strain in said electroactive element is shear-coupled between said electroactive element and said insulator;
a sensor for detecting at least one parameter of displacement of said fabricating system and producing a signal in response thereto; and
a circuit in electrical communication with said actuator assembly and said sensor;
wherein, upon the detection of said at least one parameter of displacement by said sensor, said sensor signals said circuit, which, in response, activates said actuator assembly to control vibration.

26. The fabricating system of claim 25, further comprising a control system having at least one controller that produces a signal, and which is in electrical communication with said circuit, and wherein said circuit activates said actuator assembly in response to said signal from the controller.

27. A vibration control system for use in a fabricating system, said vibration control system comprising:
   an actuator assembly for controlling vibration;
   said actuator assembly comprising
   (a) an electroactive element;
   (b) a conductor; and
   (c) an insulator;
      wherein said electroactive element, said conductor, and said insulator are bonded together such that in-plane strain in said electroactive element is shear-coupled between said electroactive element and said insulator; and
   a circuit in electrical communication with said actuator assembly;
      wherein said circuit signals said actuator assembly to control vibration of said fabricating system.

28. A vibration control system for use in a fabricating system, said vibration control system comprising:
   an actuator assembly for controlling vibration;
   said actuator assembly comprising
   (a) an electroactive element;
   (b) a conductor; and
   (c) an insulator;
      wherein said electroactive element, said conductor, and said insulator are bonded together such that in-plane strain in said electroactive element is shear-coupled between said electroactive element and said insulator;
   a sensor for detecting at least one parameter of performance of said fabricating system and producing a signal in response thereto;
   and a circuit in electrical communication with said actuator assembly and said sensor;
   wherein, upon the detection of said at least one parameter of performance by said sensor, said sensor signals said circuit, which, in response, activates said actuator assembly to control vibration.

* * * * *